US010699621B2

(12) United States Patent
Ma et al.

(10) Patent No.: US 10,699,621 B2
(45) Date of Patent: Jun. 30, 2020

(54) DISPLAY PANEL AND DISPLAY APPARATUS

(71) Applicant: Wuhan Tianma Micro-Electronics Co., Ltd., Wuhan (CN)

(72) Inventors: Yangzhao Ma, Wuhan (CN); Tianqing Hu, Shanghai (CN); Zhaokeng Cao, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/449,715

(22) Filed: Jun. 24, 2019

(65) Prior Publication Data
US 2020/0168141 A1 May 28, 2020

(30) Foreign Application Priority Data

Nov. 26, 2018 (CN) .......................... 2018 1 1417275

(51) Int. Cl.
*G09G 3/20* (2006.01)
*G11C 19/28* (2006.01)

(52) U.S. Cl.
CPC ............. *G09G 3/20* (2013.01); *G11C 19/287* (2013.01); *G09G 2310/0286* (2013.01); *G09G 2380/02* (2013.01)

(58) Field of Classification Search
CPC ............. G09G 3/20; G09G 2310/0286; G09G 238/02; G11C 19/287
See application file for complete search history.

(56) References Cited

U.S. PATENT DOCUMENTS

| 10,559,253 B1* | 2/2020 | Li ........................ H01L 27/1255 |
| 2010/0053047 A1* | 3/2010 | Chen ........................ G09G 3/20 345/84 |
| 2018/0074361 A1* | 3/2018 | Chung ................ F21V 33/0052 |

* cited by examiner

*Primary Examiner* — Stacy Khoo
(74) *Attorney, Agent, or Firm* — Anova Law Group PLLC

(57) ABSTRACT

A display panel and a display apparatus are provided. The display panel includes a plurality of first signal lines and second signal lines. A display area of the display panel includes first regular display area, second regular display area and an irregularly-shaped display area. The first signal lines disposed in the first and second regular display areas are first and second regular signal lines, respectively. The first signal lines disposed in the irregularly-shaped display area are irregularly-shaped signal lines. At least one irregularly-shaped signal line is a first irregularly-shaped signal line and the other is second irregularly-shaped signal line. A non-display area includes first driving circuit and second driving circuit. The first driving circuit is electrically connected to the first regular signal line and first irregularly-shaped signal line, and the second driving circuit is electrically connected to the second regular signal line and second irregularly-shaped signal line.

15 Claims, 19 Drawing Sheets

DISPLAY PANEL AND DISPLAY APPARATUS

CROSS-REFERENCE TO RELATED APPLICATIONS

This application claims the priority of Chinese Patent Application No. 201811417275.X, filed on Nov. 26, 2018, the entire contents of which are incorporated herein by reference.

FIELD OF THE DISCLOSURE

The present disclosure generally relates to the field of display technology and, more particularly, relates to a display panel and a display apparatus.

BACKGROUND

With the development of science and technologies, electronic devices with display panels have been commonly used in work and daily life, providing great convenience to users. As the requirements for visual effect increase, display panels with narrow borders have become the mainstream trend in the display field. Nevertheless, due to limitations in manufacturing integrated circuit chips, the soldering of flexible circuit boards and the wirings of signal lines, etc., existing display panels still have wide borders.

In order to further reduce the border width of display panels and improve the screen ratio of electronic devices, the current mainstream practice is to design the display panel having an irregular shape, that is, the shape of the display panel has an irregular rectangular shape. Although the use of the irregularly-shaped display panel may avoid some of the functional modules it the electronic device, such as camera modules, speaker modules, etc., and increase the screen ratio of the display panel, such irregularly-shaped display panel may cause denser arrangement of wirings in the border area of the display panel, resulting in significant differences in the load of the signal lines in the display panel and affecting the performance of the display panel.

Therefore, there is a need to solve technical problems to provide a display panel and a display apparatus, to increase the screen ratio of the electronic devices, reduce the difference in the load of the signal lines in the display panel and ensure the display effect.

BRIEF SUMMARY OF THE DISCLOSURE

An aspect of the present disclosure provides a display panel. The display panel includes a display area, a non-display area surrounding the display area; and at least one notch. The display area includes an irregularly-shaped edge, a plurality of first signal lines and a plurality of second signal lines, the plurality of first signal lines extending along a row direction, and the irregularly-shaped edge and the plurality of second signal lines extending along a column direction. The irregularly-shaped edge includes at least one sub-edge, the at least one sub-edge being recessed towards an inner part of the display area, thereby forming the notch. The display area includes a first regular display area, a second regular display area and an irregularly-shaped display area, the irregularly-shaped display area and the notch being arranged along the row direction, and the first regular display area and the second regular display area being disposed at two opposite sides of the irregularly-shaped display area along the column direction, respectively. A first signal line of the plurality of first signal lines disposed in the first regular display area is a first regular signal line, a first signal line of the plurality of first signal lines disposed in the second regular display area is a second regular signal line, and first signal lines of the plurality of first signal lines disposed in the irregularly-shaped display area include irregularly-shaped signal lines, the irregularly-shaped signal lines having at least one irregularly-shaped signal line as a first irregularly-shaped signal line, and other irregularly-shaped signal line as a second irregularly-shaped signal line. The non-display area includes a first driving circuit and a second driving circuit, the first driving circuit being electrically connected to the first regular signal line and the first irregularly-shaped signal line, and the second driving circuit being electrically connected to the second regular signal line and the second irregularly-shaped signal line.

Another aspect of the present disclosure provides a display apparatus. The display apparatus includes a display panel. The display panel includes a display area, a non-display area surrounding the display area; and at least one notch. The display area includes an irregularly-shaped edge, a plurality of first signal lines and a plurality of second signal lines, the plurality of first signal lines extending along a row direction, and the irregularly-shaped edge and the plurality of second signal lines extending along a column direction. The irregularly-shaped edge includes at least one sub-edge, the at least one sub-edge being recessed towards an inner part of the display area, thereby forming the notch. The display area includes a first regular display area, a second regular display area and an irregularly-shaped display area, the irregularly-shaped display area and the notch being arranged along the row direction, and the first regular display area and the second regular display area being disposed at two opposite sides of the irregularly-shaped display area along the column direction, respectively. A first signal line of the plurality of first signal lines disposed in the first regular display area is a first regular signal line, a first signal line of the plurality of first signal lines disposed in the second regular display area is a second regular signal line, and first signal lines of the plurality of first signal lines disposed in the irregularly-shaped display area include irregularly-shaped signal lines, the irregularly-shaped signal lines having at least one irregularly-shaped signal line as a first irregularly-shaped signal line, and other irregularly-shaped signal line as a second irregularly-shaped signal line. The non-display area includes a first driving circuit and a second driving circuit, the first driving circuit being electrically connected to the first regular signal line and the first irregularly-shaped signal line, and the second driving circuit being electrically connected to the second regular signal line and the second irregularly-shaped signal line Other features and advantages of the present disclosure will become more apparent via a reading of detailed descriptions of non-limiting embodiments with reference to the accompanying drawings.

BRIEF DESCRIPTION OF THE DRAWINGS

The accompanying drawings, illustrating some embodiments of the present disclosures, constitute a part of the present disclosure. These accompanying drawings together with some of the embodiments will be described in the following to illustrate the technical solutions of the present disclosure.

DETAILED DESCRIPTION

Figure 1:
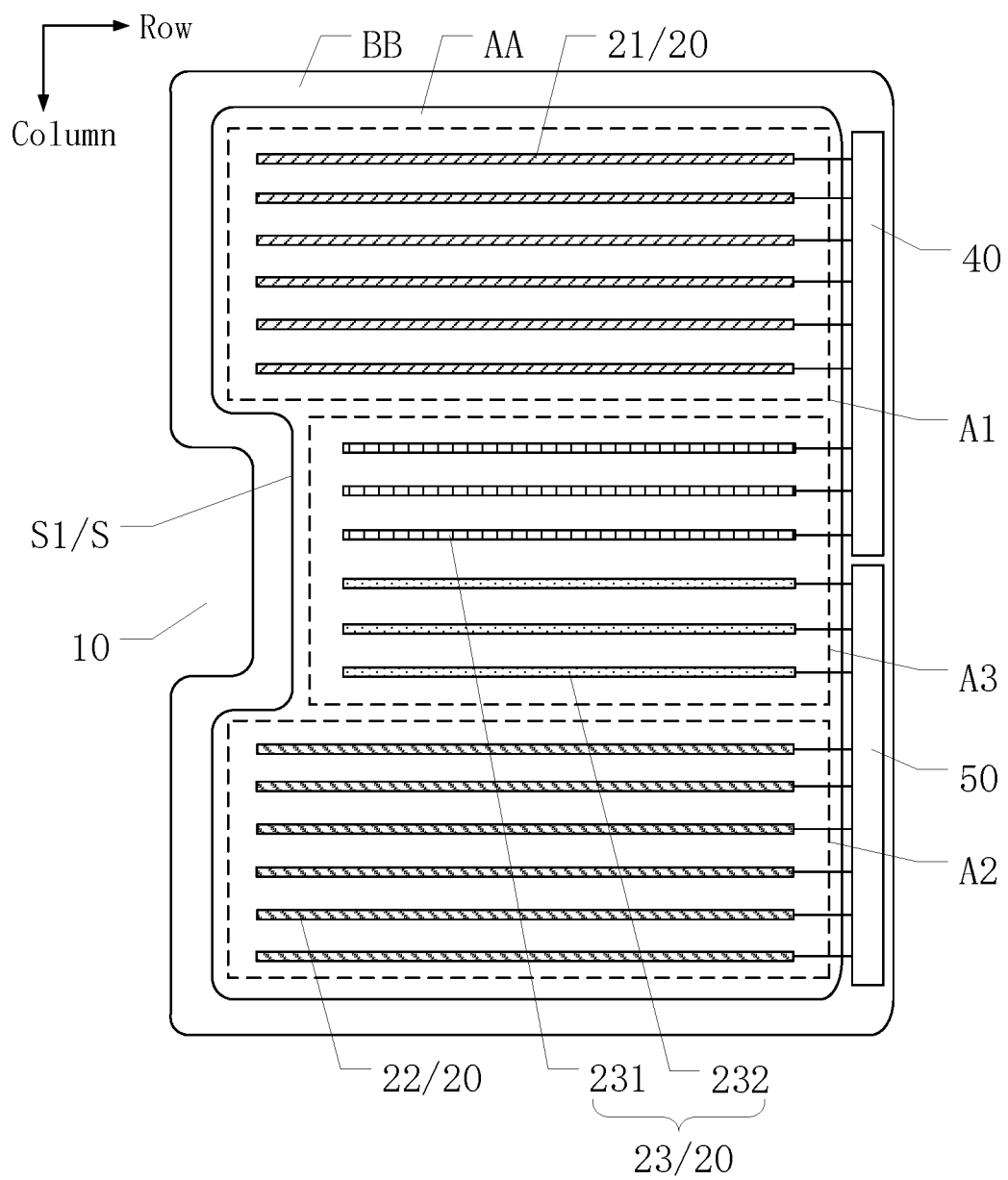
FIG. 1 illustrates a planar structure diagram of an exemplary display panel according to various embodiments of the present disclosure.

Various embodiments of the present disclosure will be described in detail as follows with reference to the accompanying drawings. It should be noted that the arrangements of the elements and steps as described in these embodiments, as well as the numeric expressions and numeric values are not intended to limit the scope of the present disclosure, unless otherwise specified.

It should be understood that, the descriptions of exemplary embodiments disclosed herein are only for illustrative purpose, not intended to limit any scope of the embodiments of the present disclosure or the implementation of these embodiments.

The technologies, methods and devices that are known to one of ordinary skill in the art will not be described in detail herein, however under certain circumstances, any technology, method and device as disclosed herein should be viewed as part of the present disclosure.

Any numeric value described in exemplary embodiments of the present disclosure is only for illustrative purposes, not intended to be limiting. Accordingly, different numeric values may be applied in other exemplary embodiments of the present disclosure.

It should be noted that similar reference numerals and letters indicate similar items in the following drawings. Thus, once an item is defined in one drawing, it is unnecessary for the item to be further discussed in subsequent drawings.

The present disclosure provides a display panel and a display apparatus. The disclosed display panel and the display apparatus may increase the screen ratio of the electronic device, and reduce the load differences of the signal lines in the display panel.

Figure 2:
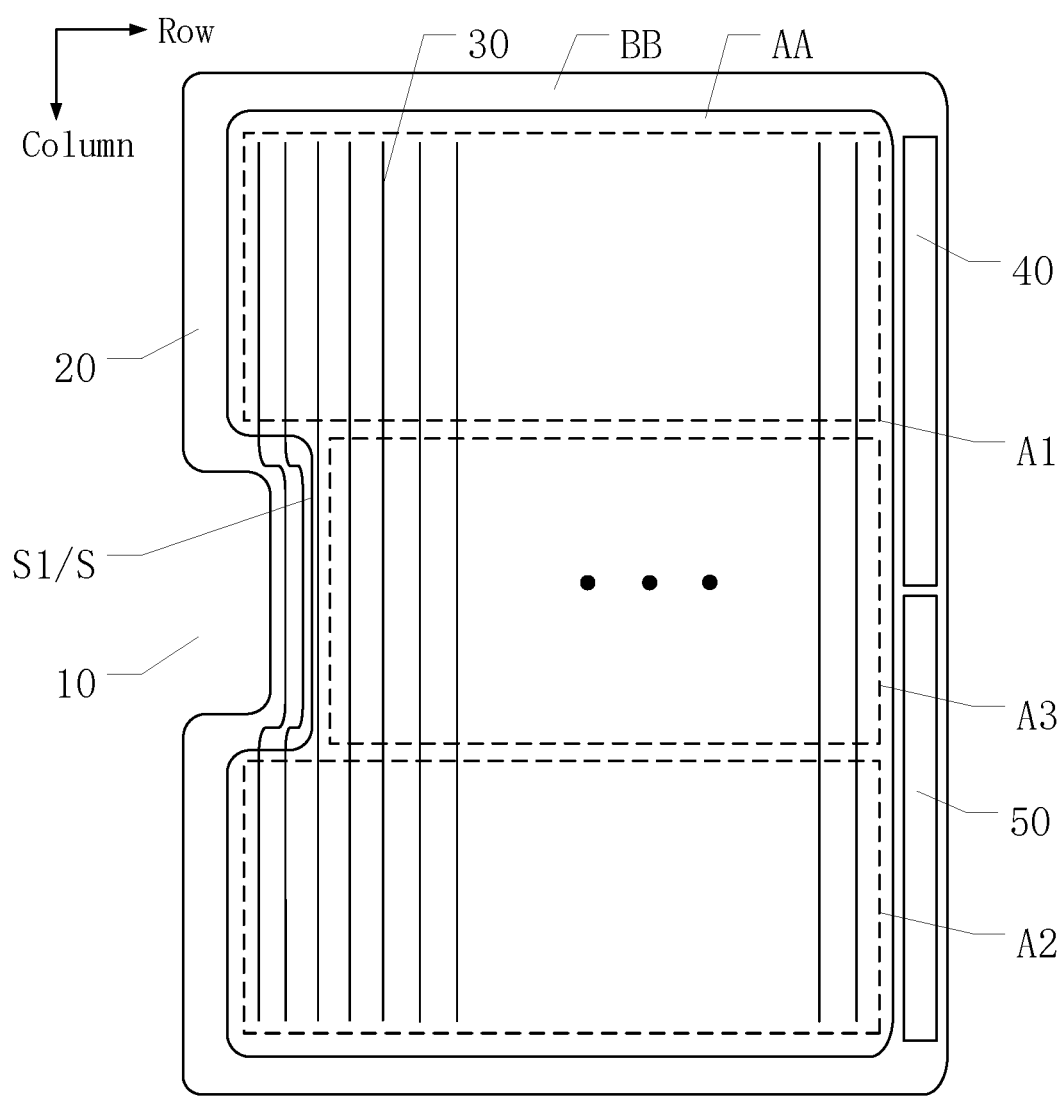
FIG. 2 illustrates a planar structure diagram of another exemplary display panel according to various embodiments of the present disclosure.

According to various embodiments of the present disclosure, referring to FIGS. 1-2, the display panel may include a display area AA, a non-display area BB surrounding the display area AA, and at least one notch 10. The display area AA may include an irregularly-shaped edge S, a plurality of first signal lines 20, and a plurality of second signal lines 30. The plurality of first signal lines 20 may extend along a row direction, and the irregularly-shaped edge S and the plurality of second signal lines 30 may extend along a column direction. The irregularly-shaped edge S may include at least one sub-edge S1, and the at least one sub-edge S1 may be recessed towards an inner part of the display area AA, thereby forming the notch 10.

The display area AA may include a first regular display area A1, a second regular display area A2, and an irregularly-shaped display area A3. The irregularly-shaped display area A3 and the notch 10 may be arranged along the row direction. The first regular display area A1 and the second regular display area A2 may be disposed at two opposite sides of the irregularly-shaped display area A3 along the column direction, respectively. The first signal line 20 located in the first regular display area A1 may be a first regular signal line 21, and the first signal line 20 located in the second regular display area A2 may be a second regular signal line 22, The first signal lines 20 located in the irregularly-shaped display area A3 may be irregularly-shaped signal lines 23. At least one irregularly-shaped signal line 23 may be a first irregularly-shaped signal line 231, and the other irregularly-shaped signal line 23 may be a second irregularly-shaped signal line 232.

The non-display area BB may include a first driving circuit 40 and a second driving circuit 50. The first driving circuit 40 may be electrically connected to the first regular signal line 21 and the first irregularly-shaped signal line 231. The second driving circuit 50 may be electrically connected to the second regular signal line 22 and the second irregularly-shaped signal line 232.

It should be noted that in order to illustrate the embodiments of the present disclosure more intuitively, the plurality of second signal lines 30 are not illustrated in the display area AA as shown in FIG. 1. Further, in order to more clearly distinguish the first regular signal line 21, the second regular signal line 22, the first irregularly-shaped signal line 231 and the second irregularly-shaped signal line 232, the illustrations of the four signal lines may be filled with different patterns. Further, the plurality of first signal lines 20 are not illustrated in FIG. 2.

Specifically, the sub-edge S1 of the irregularly-shaped edge S may be recessed towards the inner part of the display area AA, thereby forming the notch 10. The number of the notch 10 may be determined by the number of the sub-edge S1. As illustrated in FIG. 1, one sub-edge S1 may be included. Alternatively, two or more of sub-edges S1 may be included as illustrated in e.g., FIG. 3, which the present disclosure will not intend to limit. Further, the extent to which the sub-edge S1 may be recessed towards the inner part of the display area AA may be adjusted according to practical applications. As such, the size of the formed notch 10 may accommodate the requirements for installing different models of components e.g., cameras and speakers, thereby improving the screen ratio of the display panel.

Figure 3:
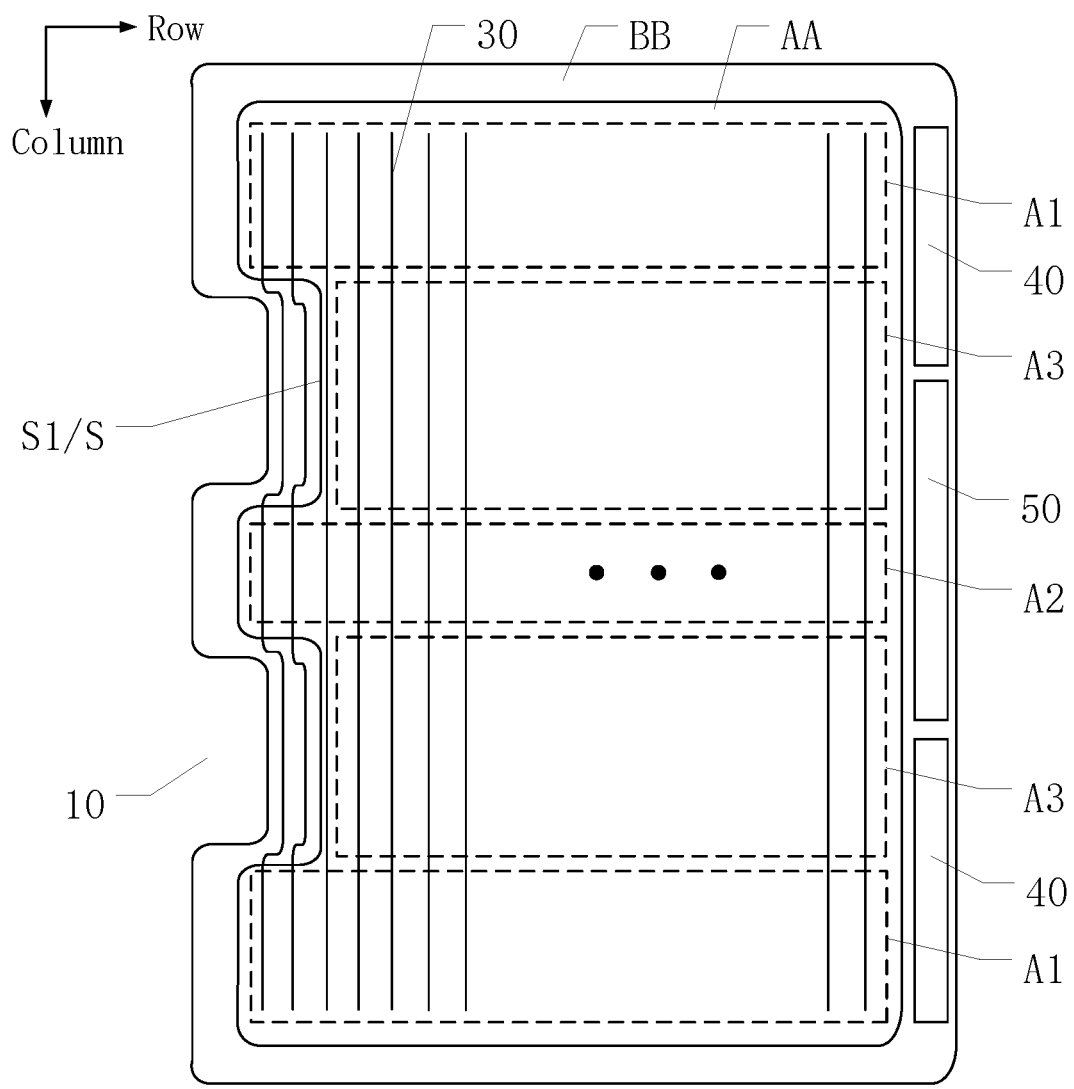
FIG. 3 illustrates a planar structure diagram of another exemplary display panel according to various embodiments of the present disclosure.

According to the embodiments of the present disclosure with reference to FIG. 3, two sub-edges S1 may form two notches 10. Two irregularly-shaped display area A3 may be formed in the display area AA adjacent to the two sub-edges S1 along the row direction. Along the column direction, the portions of the display area AA located at two opposite sides of the irregularly-shaped display area A3 may be the first regular display area A1 and the second regular display area A2, respectively. Further, one of the first regular display area A1 and the second regular display area A2 may be located between two irregularly-shaped display areas A3. The numbers of the first driving circuit 40 and the second driving circuit 50 may also be determined according to practical applications. The exemplary embodiments including two first driving circuit 40 and one second driving circuit 50 according to FIG. 3 are for illustrative purposes only and not intended to be limiting.

The notch 10 may be a through-hole penetrating the entire display panel along a thickness direction of the display panel. Alternatively, the notch 10 may be a blind hole penetrating a portion of the film layers of the display panel without influencing the functions of other components such as cameras and speakers which are subsequently installed. The blind hole may avoid the removal of the film layers, or reserve a portion of the transparent film layers. Any suitable configurations may be used for the notch, for which the present disclosure will not intend to be limiting and will not be repeated herein.

In the embodiments of the present disclosure, the first driving circuit 40 may supply driving signals to the first regular signal line 21 disposed in the first regular display area A1, and the second driving circuit 50 may supply driving signals to the second regular signal line 22 disposed in the second regular display area A2. Further, the first driving circuit 40 may supply driving signals to part of the irregularly-shaped signal lines 23 disposed in the irregularly-shaped display area A3, and the second driving circuit 50 may supply driving signals to the other part of the irregularly-shaped signal lines 23. As such, the first signal lines 20 disposed in different regions of the entire display area AA may be driven by different driving circuits, thereby reducing the difference in the load of the signal lines in the different regions of the display area AA, and improving the uniformity of the displayed images of the display panel.

Further, the arrangements of the wirings between the first signal lines 20 and the first driving circuit 40 as well as the second driving circuit 50 may be adjusted according to practical applications, thereby reducing the density of the wirings and the coupling effect among the wirings. As such, the width of the non-display area BB along the row direction may further be reduced. Furthermore, the detailed arrangements of the first driving circuit 40 and the second driving circuit 50 in the non-display area BB may be determined according to practical applications, for which the present disclosure will not intend to be limiting. The arrangements of the first driving circuit 40 and the second driving circuit 50 disposed at a same side of the display area AA as shown in FIG. 3 are for illustrative purposes only and not intended to be limiting.

The display panel according to various embodiments of the present disclosure may have the technical benefits in the following. An irregularly-shaped edge of the display panel may include a sub-edge where a notch may be formed. Functional components including cameras and speakers may be disposed in the notch area, such that the screen ratio of the display panel may be improved, fulfilling diverse needs for visual effects from users. The first regular signal line disposed in the first regular display area and the first irregularly-shaped signal line disposed in the irregularly-shaped display area may be driven by the first driving circuit. The second regular signal line disposed in the second regular display area and the second irregularly-shaped signal line disposed in the irregularly-shaped display area may be driven by the second driving circuit. On one hand, such design may reduce the wiring density in the non-display area, further improving the screen ratio of the display panel. On the other, such design may reduce the difference in the load of the signal lines disposed in the first regular display area, the second regular display area and the irregularly-shaped display area, improving the uniformity in the brightness of the displayed images, ensuring the display quality of the display panel. In addition, two driving circuits including the first driving circuit and the second driving circuit, may be disposed, respectively. As such, it may be more flexible and convenient to arrange the wirings for the driving circuits in the non-display area, thereby significantly reducing the difficulty in manufacturing display apparatuses and improving the production efficiency.

Figure 4:
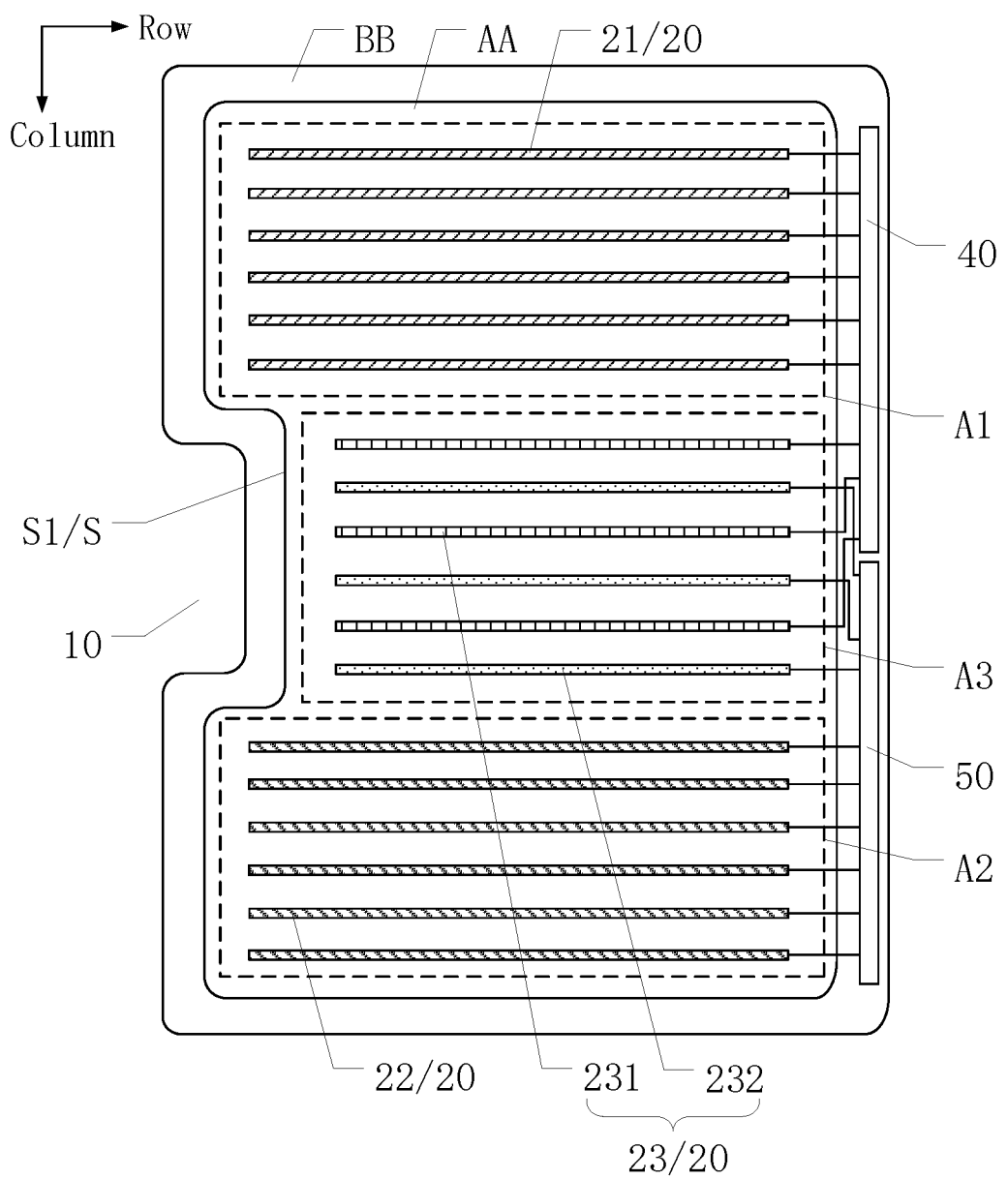
FIG. 4 illustrates a planar structure diagram of another exemplary display panel according to various embodiments of the present disclosure.

In one embodiment of the present disclosure with reference to FIG. 4, the first irregularly-shaped signal line 231 may be an odd-numbered row of irregularly-shaped signal line 23, and the second irregularly-shaped signal line 232 may be an even-numbered row of irregularly-shaped signal line 23. Alternatively, the first irregularly-shaped signal line 231 may be an even-numbered row of irregularly-shaped signal line 23, and the second irregularly-shaped signal line 232 may be an odd-numbered row of irregularly-shaped signal line 23.

According to the embodiments of the present disclosure, in the irregularly-shaped display area A3, the odd-numbered row of irregularly-shaped signal lines 23 and the even-numbered row of irregularly-shaped signal lines 23 may be driven by the first driving circuit 40 and the second driving circuit 50, respectively. Alternatively, the odd-numbered row of irregularly-shaped signal lines 23 and the even-numbered row of irregularly-shaped signal lines 23 may be driven by the second driving circuit 50 and the first driving circuit 40, respectively. As such, the difference in the load of the irregularly-shaped signal lines 23 may further be reduced. Further, when the display panel displays images, the occurrence of horizontal stripes in the irregularly-shaped display area. A3 may be effectively avoided, improving the display quality of the display apparatus.

As illustrated in FIG. 4, the first irregularly-shaped signal line 231 may be the odd-numbered row of irregularly-shaped signal lines 23 and electrically connected to first driving circuit 40, and the second irregularly-shaped signal line 232 may be the even-numbered row of irregularly-shaped signal lines 23 and electrically connected to second driving circuit 50. Nevertheless, it should be noted that FIG. 4 is illustrative purposes only, and not intended to be limiting. When the first irregularly-shaped signal line 231 is the even-numbered row of irregularly-shaped signal lines 23 and the second irregularly-shaped signal line 232 is the odd-numbered row of irregularly-shaped signal lines 23, the connections between the irregularly-shaped signal lines 23 and the driving circuits may be adjusted accordingly based on the illustrations of FIG. 4.

Figure 5:
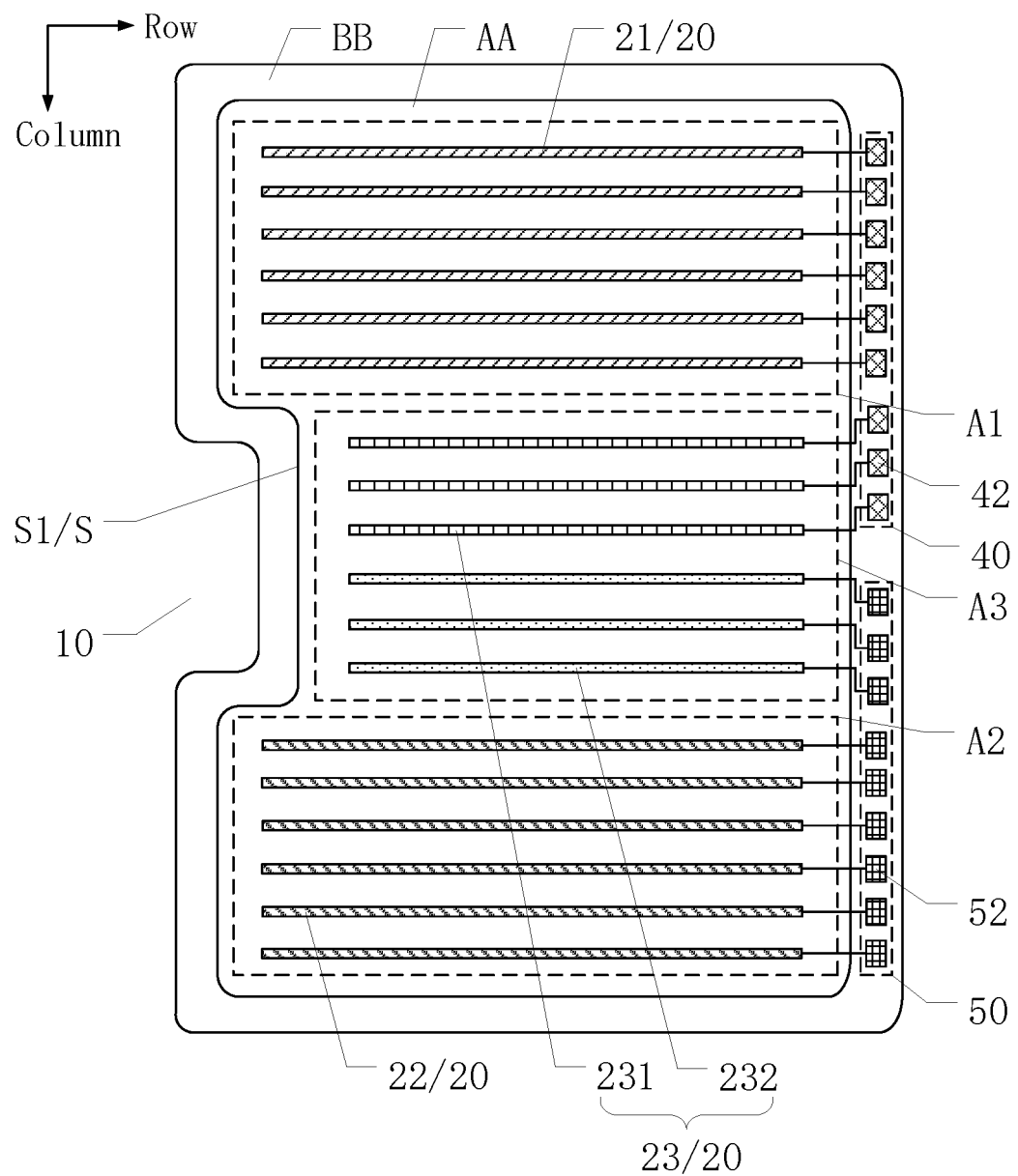
FIG. 5 illustrates a planar structure diagram of another exemplary display panel according to various embodiments of the present disclosure.
Figure 6:
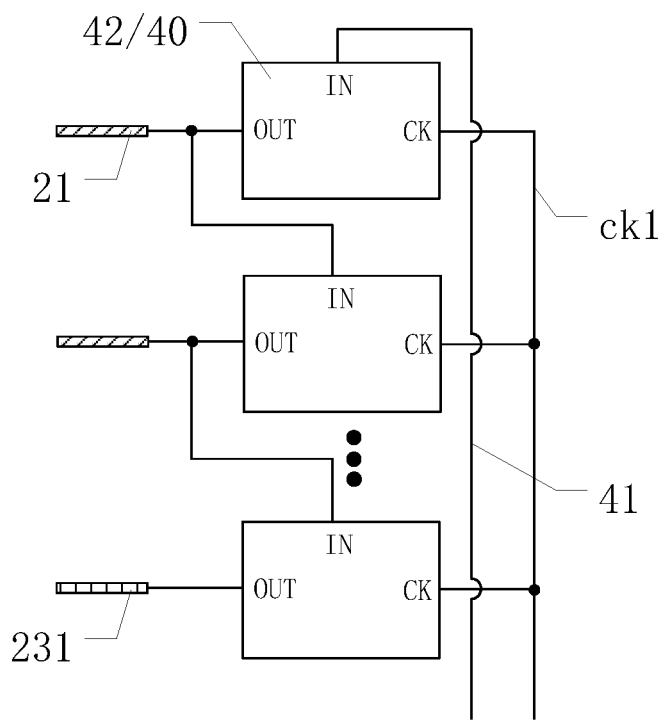
FIG. 6 illustrates a schematic diagram of a first driving circuit in an exemplary display panel according to various embodiments of the present disclosure.
Figure 7:
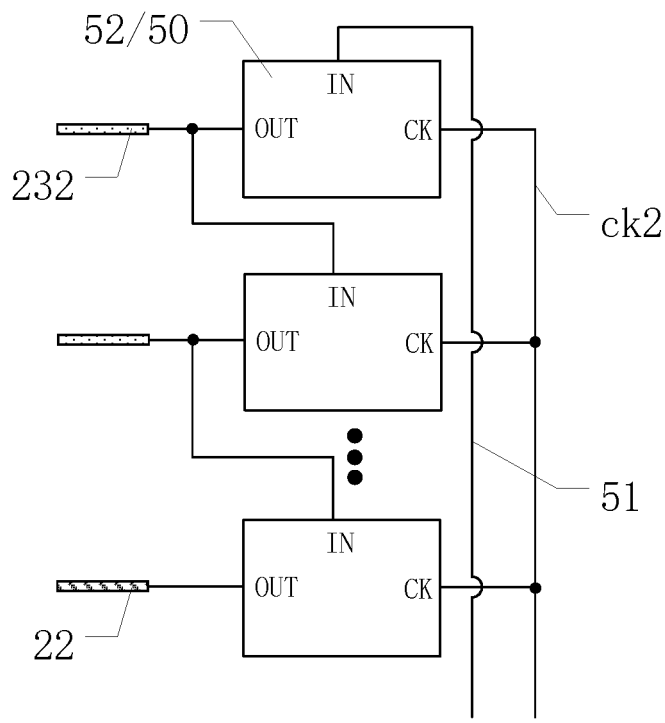
FIG. 7 illustrates a schematic diagram of a second driving circuit in an exemplary display panel according to various embodiments of the present disclosure.

In one embodiment of the present disclosure with reference to FIGS. 5-7, the first driving circuit 40 may include a first initialization signal line 41 and a plurality of first shift registers 42 connected in cascade (end-to-end). An output terminal of a first shift register of the plurality of first shift registers 42 may be electrically connected to at least one first regular signal line 21 and/or at least one first irregularly-shaped signal line 231. An input terminal of a first level first shift register of the plurality of first shift registers 42 may be electrically connected to the first initialization signal line 41.

The second driving circuit 50 may include a second initialization signal line 51 and a plurality of plurality of second shift registers 52 connected in cascade (end-tip-end). An output terminal of a second shift register of the plurality of second shift registers 52 may be electrically connected to at least one second regular signal line 22 and/or at least one second irregularly-shaped signal line 232. An input terminal of a first level second shift register of the plurality of second shift registers 52 may be electrically connected to the second initialization signal line 51.

In the embodiments of the present disclosure with reference to FIG. 6, an input terminal CK of each level first shift register of the first shift registers 42 may receive timing signals supplied by a clock signal line ck1. An input terminal IN of a first level first shift register of the first shift registers 42 may receive an initialization signal supplied by the first initialization line 41. Starting from a second level first shift register of the first shift registers 42, an input terminal IN of a subsequent level first shift register of the first shift registers 42 may be electrically connected to an output terminal OUT of a previous level first shift register of the first shift registers 42. As such, the first regular signal line 21 and the first irregularly-shaped signal line 231 may be conducted to a turn-on state in a level-by-level manner, and the conduction duration of each first regular signal line 21 or the conduction duration of each first irregularly-shaped signal line 231 may be a time length of a timing signal supplied by the clock signal line ck1.

In the embodiments of the present disclosure with reference to FIG. 7, an input terminal CK of each level second shift register of the second shift registers 52 may receive timing signals supplied by a clock signal line ck2. An input terminal IN of a first level second shift register of the second shift registers 52 may receive an initialization signal supplied by the second initialization line 51. Starting from a second level second shift register of the second shift registers 52, an input terminal IN of a subsequent level second shift register of the second shift registers 52 may be electrically connected to an output terminal OUT of a previous level second shift register of the second shift registers 52. As such, the second regular signal line 22 and the second irregularly-shaped signal line 232 may be conducted to a turn-on state in a level-by-level manner, and the conduction duration of each second regular signal line 22 or the conduction duration of each second irregularly-shaped signal line 232 may be a time length of a timing signal supplied by the clock signal line ck2.

It should be noted that in order to ensure the uniformity of the displayed images, the time length of the timing signal supplied by the clock signal line ck1 may be the same as the time length of the timing signal supplied by the clock signal line ck2. The initialization signal supplied by the first initialization signal line 41 and the initialization signal supplied by the second initialization signal line 51 may not be synchronized. As illustrated in the planar structure diagram of FIG. 5, for example, when the first driving circuit 40 and the second driving circuit 50 conduct the first signal lines 20 to a turn-on state in a level-by-level manner, from a first row of the first signal line 20 to a last row of the first signal line 20, then a time difference may exist between the first initialization signal line 41 and the second initialization signal line 51. Nevertheless, the displayed images may have uniformity. That is, the time length of the timing signals as well as the time difference between the first initialization signal and the second initialization signal may be adjusted according to practical applications, for which the present disclosure will not intend to be limiting.

Figure 8:
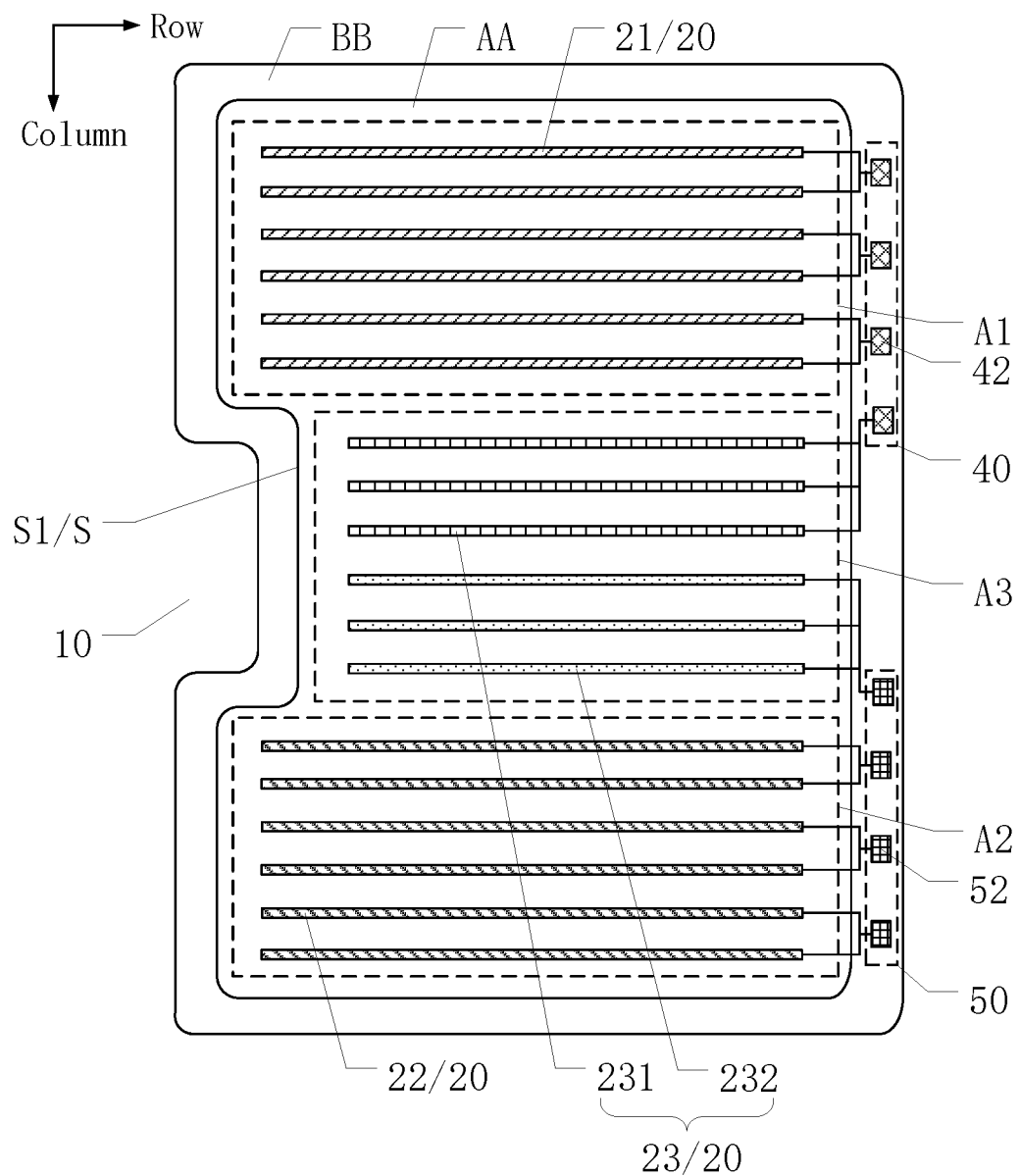
FIG. 8 illustrates a planar structure diagram of another exemplary display panel according to various embodiments of the present disclosure.

In one embodiment of the present disclosure with reference to FIG. 8, an output terminal of a first shift register 42 may be electrically connected to at least two first regular signal lines 21 or at least two first irregularly-shaped signal lines 231. Alternatively, the output terminal of a first shift register 42 may be electrically connected to at least two first regular signal lines 21 and at least two first irregularly-shaped signal lines 231. An output terminal of a second shift register 52 may be electrically connected to at least two second regular signal lines 22 or at least two second irregularly-shaped signal lines 232. Alternatively, the output terminal of a second shift register 52 may be electrically connected to at least two second regular signal lines 22 and at least two second irregularly-shaped signal lines 232.

In the embodiments of the present disclosure, the output terminal of the first shift register 42 and the output terminal of the second shift register 52 may each be electrically connected to at least two first signal lines 20. That is, one shift register may supply driving signals to at least two of the first signal lines 20, thereby reducing the number of the shift registers and saving more space in the non-display area BB for arranging wires and installing components.

It should be noted that the number of the first signal lines 20 which are electrically connected to each of the first shift registers 42 in the first driving circuit 40 may not be the same. Similarly, the number of the first signal lines 20 which are electrically connected to each of the second shift registers 52 in the second driving circuit 50 may not be the same. As exemplarily illustrated in FIG. 8, in the first driving circuit 40, a portion of the first shift registers 42, e.g., some first shift registers 42, may each be electrically connected to two first regular signal lines 21, and another portion (e.g., a remaining portion) of the first shift registers 42, e.g., some other first shift registers 42, may each electrically connected to three first irregularly-shaped signal lines 231. In the second driving circuit 50 as illustrated in FIG. 9, a portion of the second shift registers 52 may each be electrically connected to two second regular signal lines 22, and another portion (e.g., a remaining portion) of the second shift registers 52 may each be electrically connected to three second irregularly-shaped signal lines 232.

Figure 9:
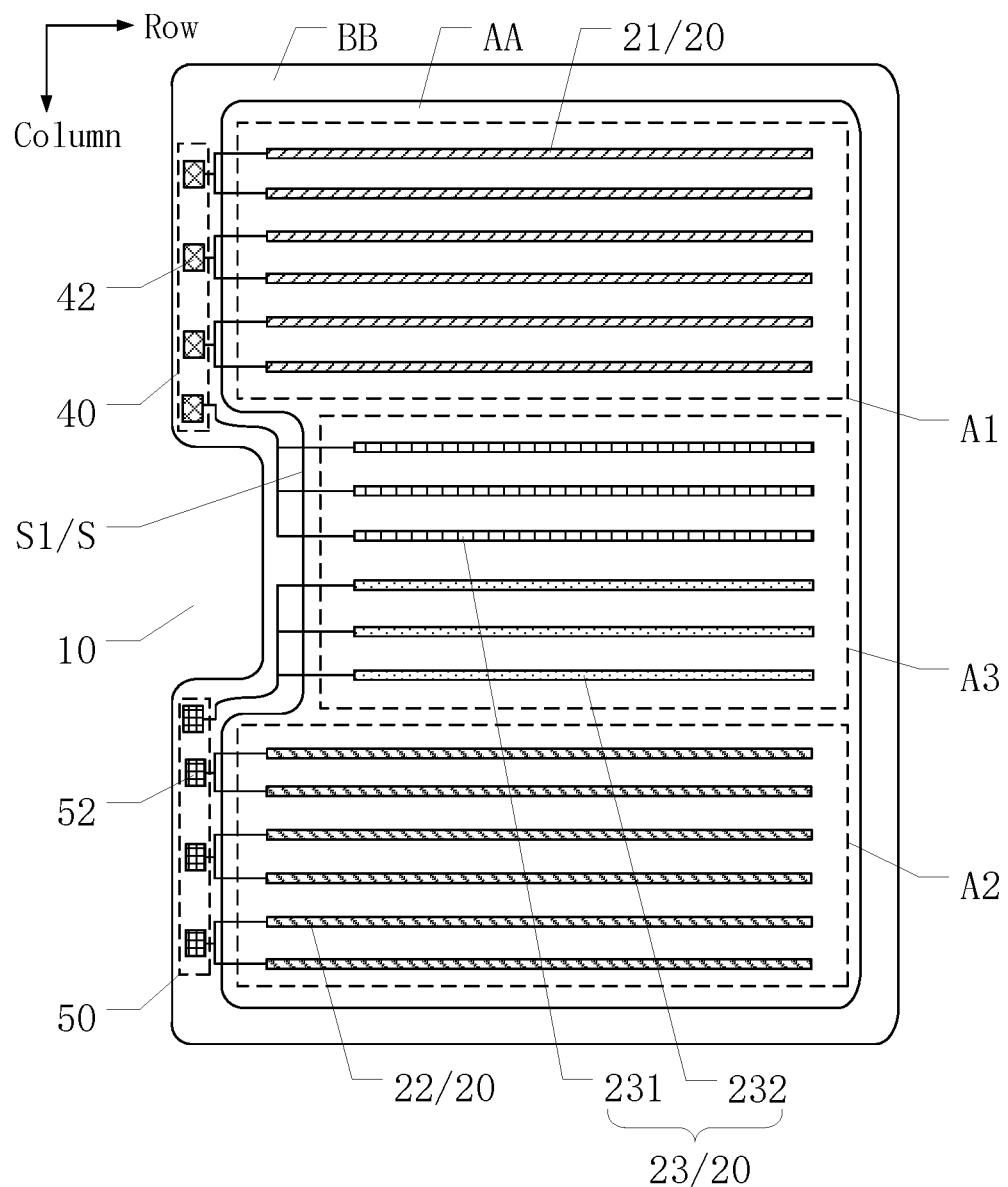
FIG. 9 illustrates a planar structure diagram of another exemplary display panel according to various embodiments of the present disclosure.

With reference to FIG. 9, additionally, because of the reduction in the number of the shift registers, the first driving circuit 40 and the second driving circuit 50 may be disposed at some positions of the non-display area BB which may not be adjacent to the notch 10. As such, the sub-edges S1 may have more recess towards the inner part of the display area AA, thereby providing more space for installing other components without influencing the display performance of the display panel.

Figure 10:
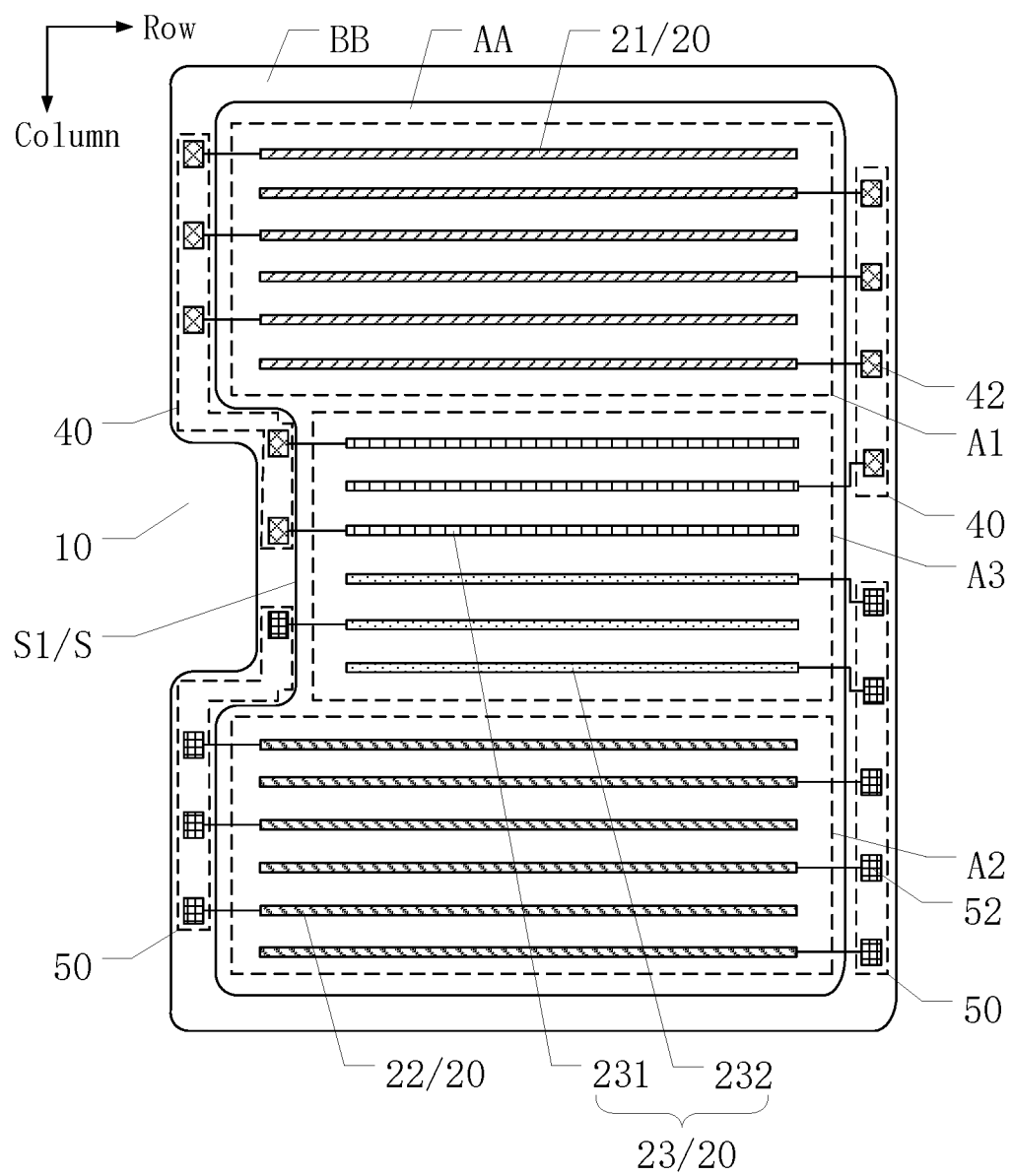
FIG. 10 illustrates a planar structure diagram of another exemplary display panel according to various embodiments of the present disclosure.

In one embodiment of the present disclosure with reference to FIG. 10, two of the first driving circuits 40 may be disposed at two opposite sides of the display area AA along the row direction. Two of the second driving circuits 50 may be disposed at two opposite sides of the display area AA along the row direction.

In the embodiments of the present disclosure, the first driving circuit 40 and the second driving circuit 50 may be disposed at each of the two opposite sides of the display are AA along the row direction. The first driving circuit 40 may supply driving signals to the first regular signal line 21 and to the first irregularly-shaped signal line 231, and the second driving circuit 50 may supply driving signals to the second regular signal line 22 and to the second irregularly-shaped signal line 232. As such, it may be more flexible and convenient to arrange the wires and the shift registers.

As illustrated in FIG. 10, two of the first driving circuits 40 which are located laterally at two opposite sides of the display area, may cross drive the first regular signal line 21 and the first irregularly-shaped signal line 231. Two of the second driving circuits 50 which are located laterally at two opposite sides of the display area, may cross drive the second regular signal line 22 and the second irregularly-shaped signal line 232. Nevertheless, it should be noted that FIG. 10 is for illustrative purposes only, and not intended to be limiting. The arrangements of the two of the first driving circuits 40 and two of the second driving circuits 50, as well as the corresponding shift registers may be adjusted, for which the present disclosure will not intend to be limiting.

Figure 11:
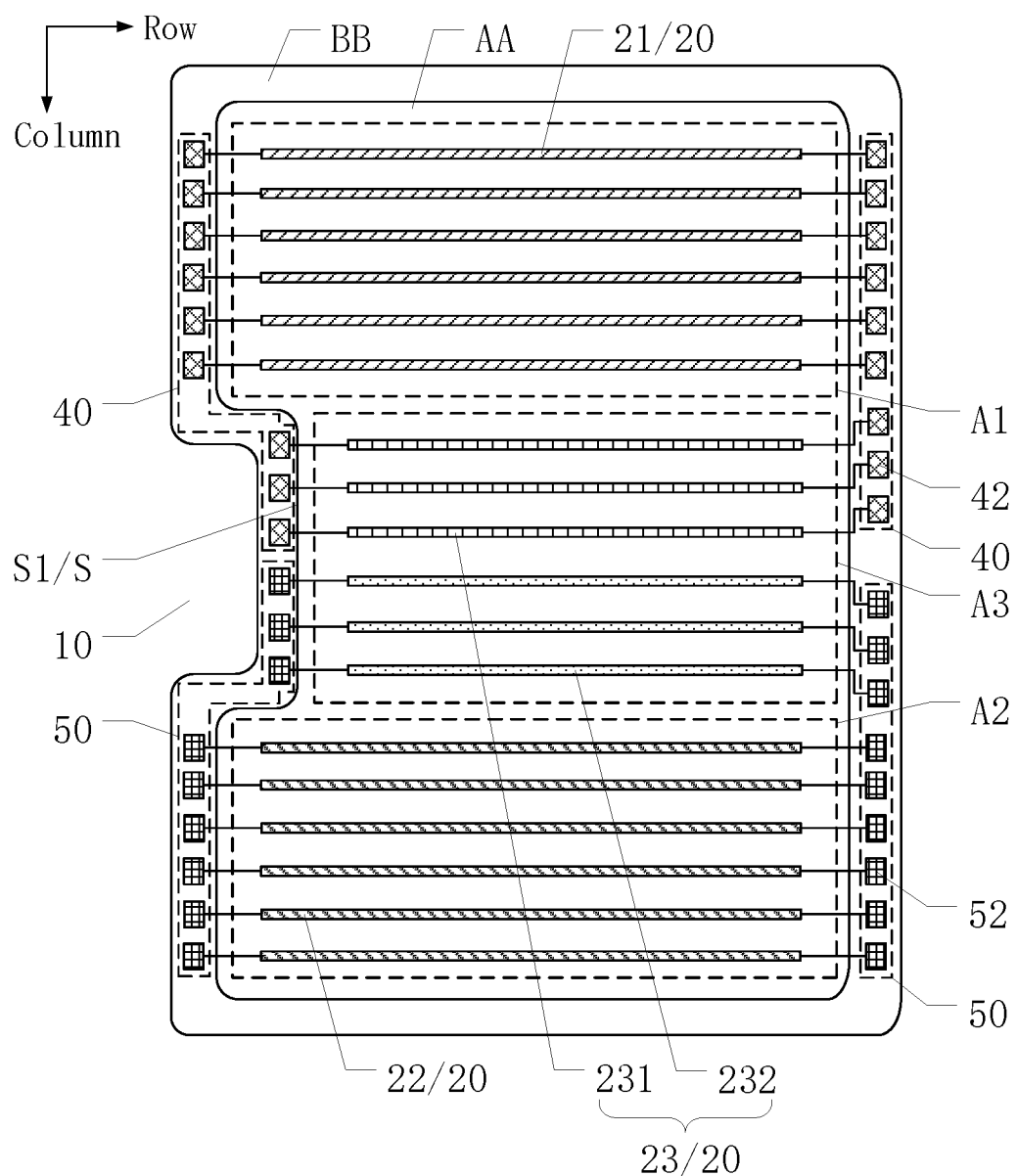
FIG. 11 illustrates a planar structure diagram of another exemplary display panel according to various embodiments of the present disclosure.

In one embodiment of the present disclosure with reference to FIG. 11, one terminal of the first regular signal line 21 may be electrically connected to a first shift register 42 located in one of the first driving circuits 40, and another terminal of the first regular signal line 21 may be electrically connected to a first shift register 42 located in another one of the first driving circuits 40. One terminal of the second regular signal line 22 may be electrically connected to a second shift register 52 located in one of the second driving circuits 50, and another terminal of the second regular signal line 22 may be electrically connected to a second shift register 52 located in another one of the second driving circuits 50. That is, two of the first driving circuits 40 may drive each of the first regular signal line 21 bilaterally, and two of the second driving circuits 50 may drive each of the second regular signal line 22 bilaterally.

According to the embodiments of the present disclosure using the first regular signal line 21 as an example, both terminals of the first regular signal line 21 may be supplied with driving signals. As such, signal delay among the pixels connected to a same first regular signal line 21 may be effectively reduced, thereby improving the uniformity of the displayed images and further fulfilling widescreen display.

Figure 12:
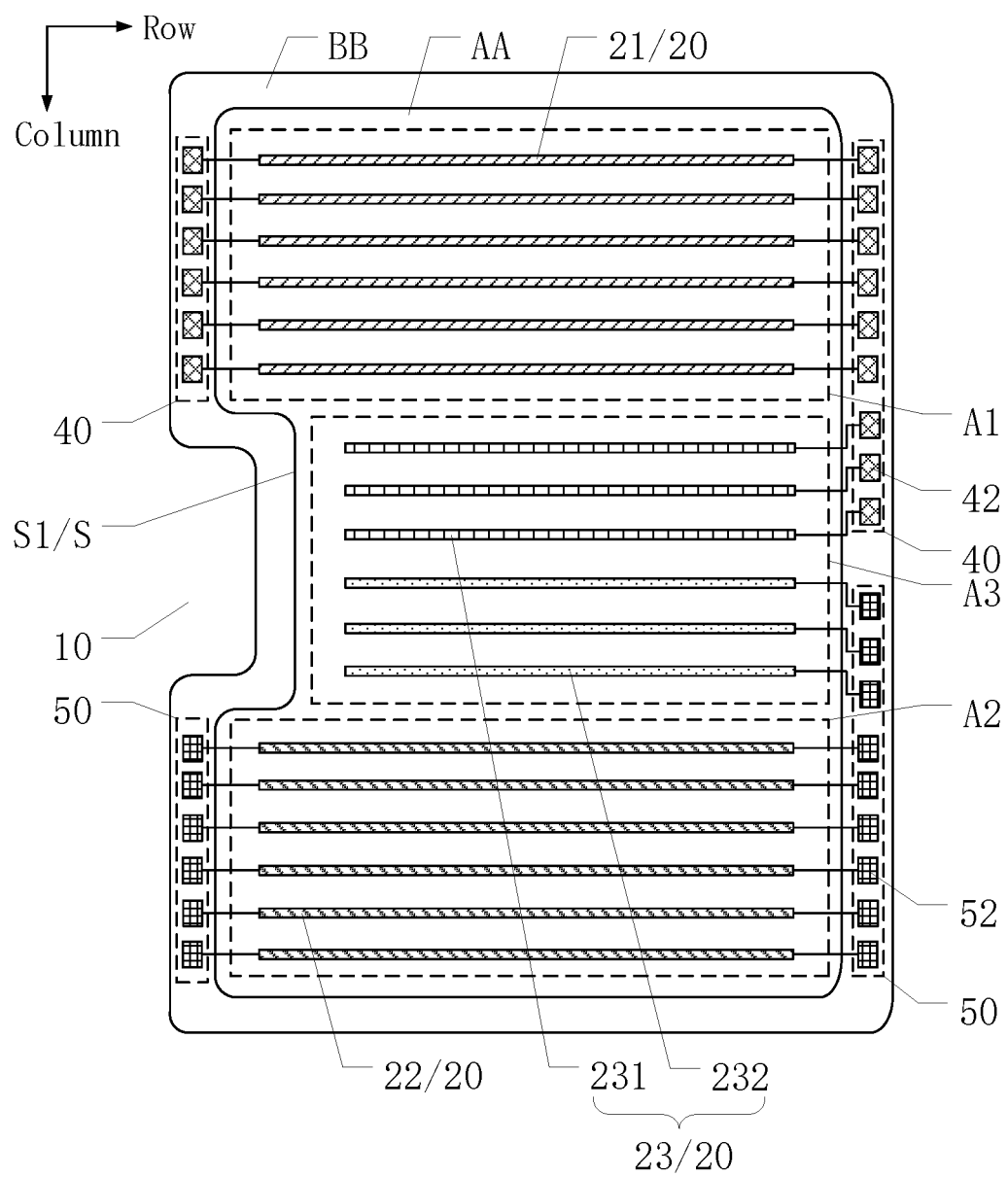
FIG. 12 illustrates a planar structure diagram of another exemplary display panel according to various embodiments of the present disclosure.

In one embodiment of the present disclosure with reference to FIG. 12, one terminal of the first irregularly-shaped signal line 231 which is away from the notch 10, may be electrically connected to the first shift register 42, and one terminal of the second irregularly-shaped signal line 232 which is away from the notch 10, may be electrically connected to the second shift register 52.

In the embodiments of the present disclosure with reference to FIG. 2, a plurality of second signal lines 30 may extend along the column direction. Accordingly, it may require at least one of the second signal lines 30 being disposed away from the notch 10. Part of the non-display area BB, which is adjacent to the sub-edge S1, may provide some wiring space for these second signal lines 30. The wiring density in this part of the non-display area BB adjacent to the sub-edge S1 may be higher as compared to the wiring densities in other areas. Therefore, for narrow-screen display panels or display panels with better driving capability, driving signals may only supply to one terminal of the first irregularly-shaped signal line 231 away from the notch 10, and to one terminal of the second irregularly-shaped signal line 232 away from the notch 10. As such, both the number of the required shift registers and the coupling effect between the wires in the wiring spaces may be reduced, while ensuring the performance of the display panel.

For the first signal lines 20 disposed in the first regular display area A1 and the second regular display area A2, the arrangements of the shift registers may be referred to the aforementioned embodiments of the present disclosure, which will not be repeated herein.

Figure 13:
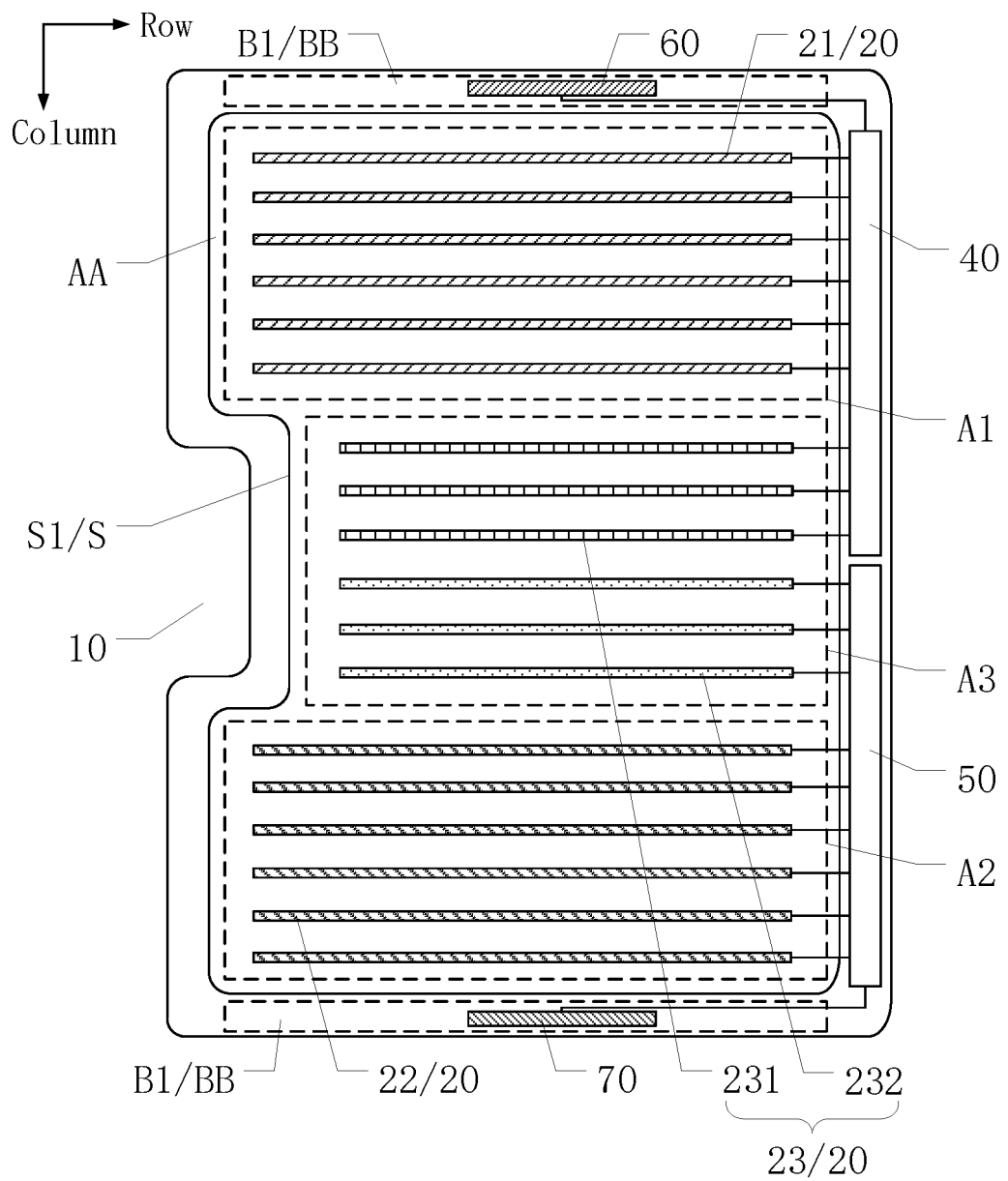
FIG. 13 illustrates a planar structure diagram of another exemplary display panel according to various embodiments of the present disclosure.

In one embodiment of the present disclosure with reference to FIG. 13, the non-display area BB may include a first sub-area B1 and a second sub-area B2. The first sub-area B1 and the second sub-area B2 may be located at two opposite sides of the display area AA along the column direction. The first sub-area. B1 may include at least one first driving unit 60, and the at least one first driving unit 60 may be electrically connected to the first driving circuit 40. The second sub-area B2 may include at least one second driving unit 70, and the at least one second driving unit 70 may be electrically connected to the second driving circuit 50.

Figure 14:
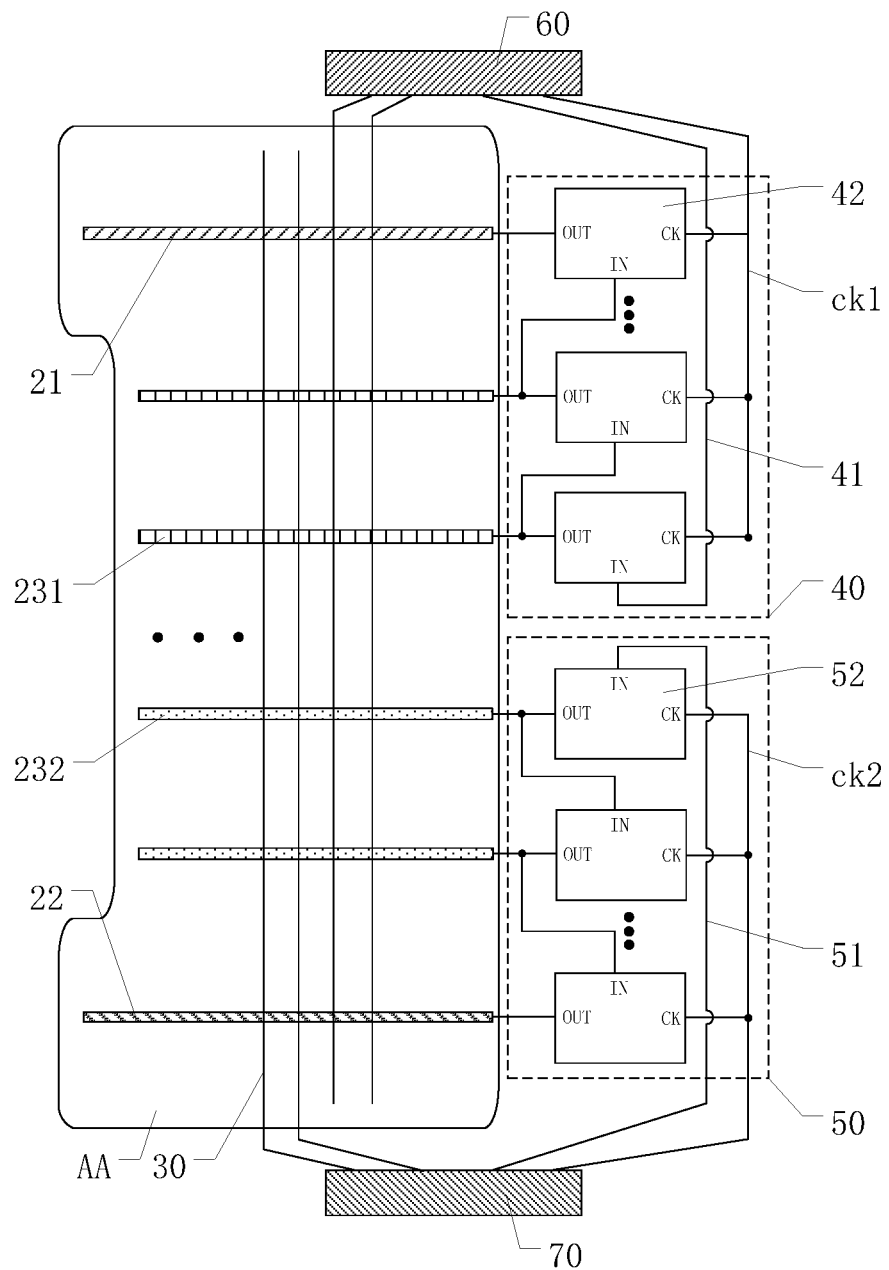
FIG. 14 illustrates a schematic diagram of wiring structures of a driving unit as illustrated in FIG. 13 in the exemplary display module according to various embodiments of the present disclosure.

In the embodiments of the present disclosure with reference to FIG. 14, the first driving circuit 40 may be driven by the at least one first driving unit 60, and the second driving circuit 50 may be driven by the at least one second driving unit 70, respectively. The numbers and locations of the first driving circuits 40 and the second driving circuits 50 may be determined according to practical applications. Further, the numbers and locations of the at least one first driving unit 60 in the first sub-area B1, as well as the numbers and locations of the at least one second driving unit 70 in the second sub-area B2, may be adjusted according to practical applications, for which the present disclosure will not intend to be limiting. FIG. 14 illustrates one first driving; circuit 40, one second driving circuit 50, one first driving unit 60 and one second driving circuit 70, where the first driving circuit 40 and the second driving circuit 50 are disposed at a same side of the display area AA along the row direction. Nevertheless, it should be noted that FIG. 14 is for illustrative purposes only, and not intended to be limiting. Furthermore, based on the positions of the first driving circuit 40 and the second driving circuit 50, the positions of a first level first shift register of the first shift registers 42 and a first level second shift register of the second shift registers 52 may be determined by the arrangements of the first irregularly-shaped signal line 231 and the second irregularly-shaped signal line 232 located in the irregularly-shaped display area A3.

Specifically, in the first driving circuit 40, the clock signal line ck1 and the first initialization signal line 41 may supply corresponding signals directly through the first driving unit 60, and conduct the corresponding first signal lines 20 to a turn-on state through the first shift registers 42. Similarly, in the second driving circuit 50, the clock signal line ck2 and the second initialization signal line 51 may supply corresponding signals directly through the second driving unit 70, and conduct the corresponding first signal line 20 to a turn-on state through the second shift register 52. Furthermore, in the display area AA, part of the second signal lines 30 may be directly driven by the first driving unit 60, and the other part of the second signal lines 30 may be directly driven by the second driving unit 70. On one side, it may reduce the difficulty of driving the first signal lines 20 and the second signal lines 30. On the other, it may reduce the difference in the displayed images at different regions of the display area AA, and improve the display quality.

It should be noted that the first driving unit 60 and the second driving unit 70 may be IC driving chips. The IC driving chips have various advantages including small size and capability of integrating large quantity of microelectronic components, such as transistors and capacitors. As such, the width of the non-display area BB along the column direction may further be reduced, thereby improving the screen ratio of the display panel.

In one embodiment of the present disclosure with reference to FIGS. 13-14, the first signal lines 20 may be scanning signal lines or light-emitting control signal lines. The second signal lines 30 may be data signal lines.

Generally, a plurality of pixels is disposed in the display area AA of the display panel, to realize the function of displaying images. In the embodiments of the present disclosure, the first driving circuit 40 and the second driving circuit 50 may supply driving signals to the first signal lines 20. When the first signal lines 20 are scanning signal lines, the pixels connected to the scanning signal lines may be selected to receive signals from the second signal lines 30, that is, to receive data signals from data signal lines. As such, the selected pixels may emit light, and the time length of the light emitting may be controlled by light-emitting controls signal lines connected to these pixels. That is, in the display area AA, the first signal lines 20 may be scanning signal lines, or combinations of scanning signal lines and light-emitting control signal lines. The detailed driving manners of these scanning signal lines and light-emitting control signal lines, by the first driving unit 40 and the second driving unit 50, may be referred to aforementioned embodiments of the present disclosure. The first driving circuit 40 may sequentially supply scanning signals to the scanning signal lines in a row-by-row manner, the pixels in the display area. AA may be sequentially turned on in the row-by-row manner, until it changes to next image frame under the functions of the clock signal line ck1 and the clock signal line ck2.

Figure 15:
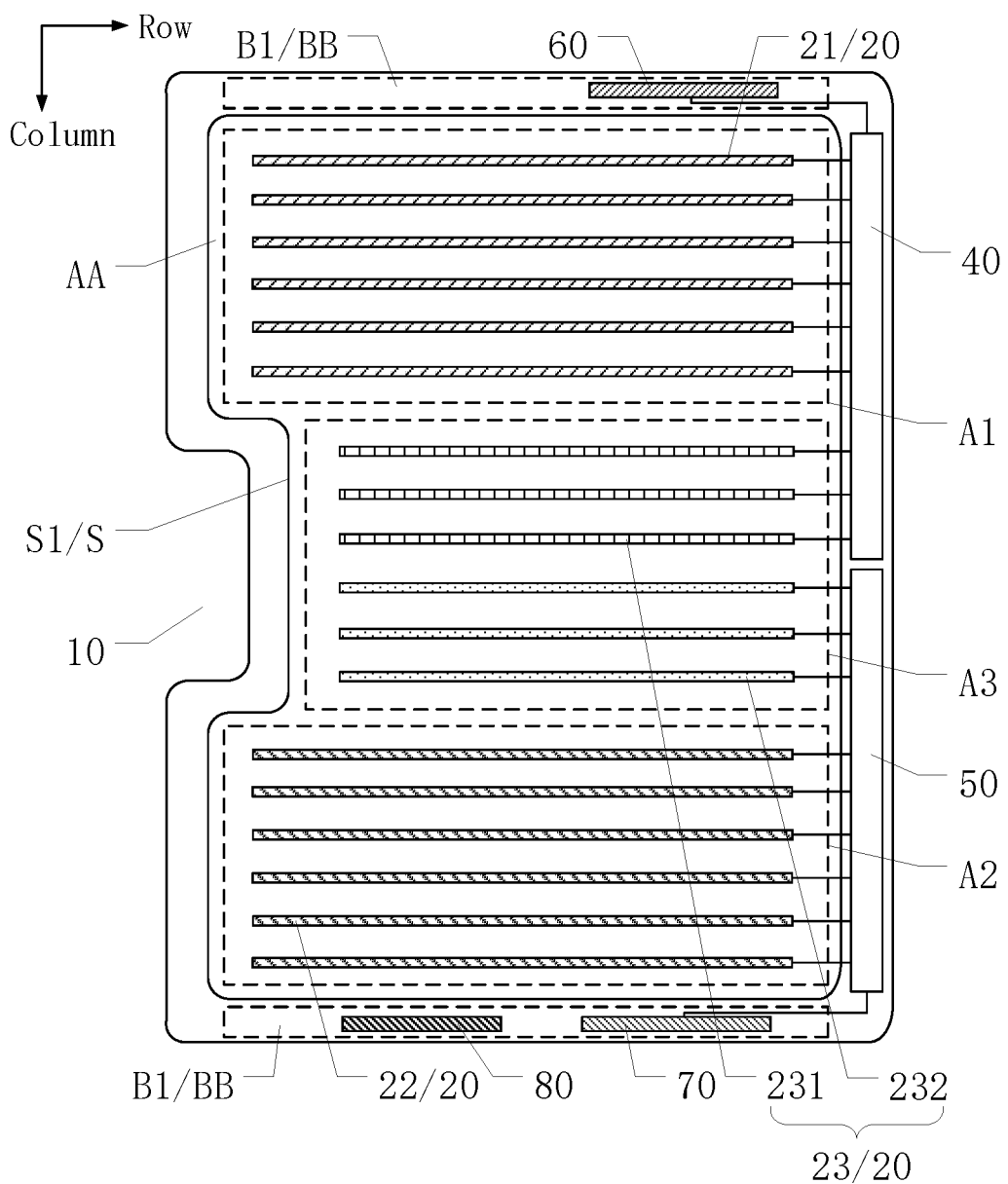
FIG. 15 illustrates a planar structure diagram of another exemplary display panel according to various embodiments of the present disclosure.
Figure 16:
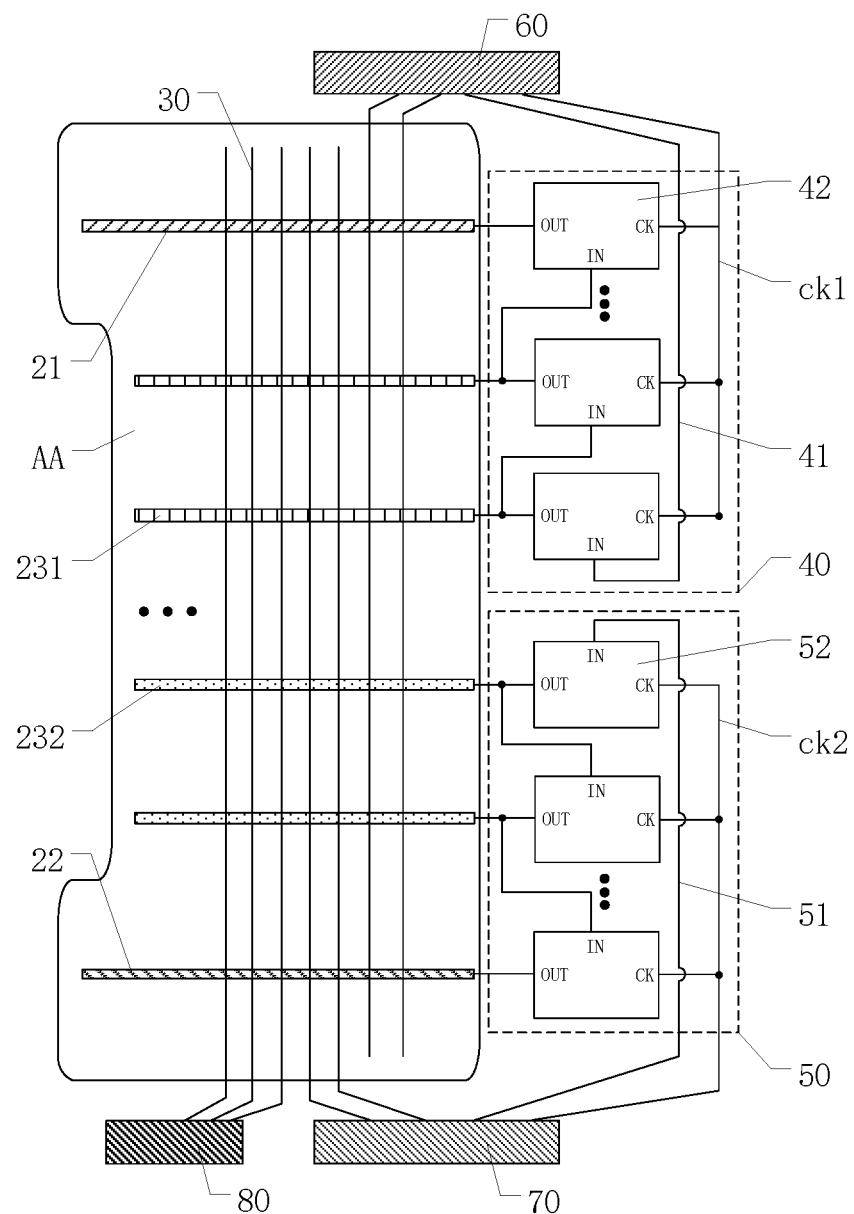
FIG. 16 illustrates a schematic diagram of wiring structures of a driving unit as illustrated in FIG. 15 in the exemplary display module according to various embodiments of the present disclosure.

In one embodiment of the present disclosure with reference to FIGS. 15-16, the non-display area BB may further include a third driving unit 80. The third driving unit 80 may be disposed in one of the first sub-area B1 and the second sub-area B2, and may be electrically connected to at least one of the second signal lines 30. That is, at least one of the second signal lines 30 may be driven by the third driving unit 80.

In the embodiments of the present disclosure, the third driving unit 80 may be an IC driving chip, with the advantages as described above in the aforementioned embodiments regarding the first driving unit 60 and the second driving unit 70. The number of the third driving unit 80 may be one, two or even more than two. Any one of the third driving units 80 may be disposed in the first sub-area B1 or in the second sub-area B2, for which the present disclosure will not intend to be limiting. In some of the embodiments of the present disclosure, one single third driving unit 80 disposed in the second sub-area B2 may be included. Nevertheless, it is for exemplary purposes only and not intended to be limiting.

In the case where the number of the second signal lines 30 was large, the arrangement of the third driving unit 80 may effectively reduce the load difference among the second signal lines 30, thereby reducing the difference along the row direction in the displayed images and further improving the display quality of the display panel.

Figure 17:
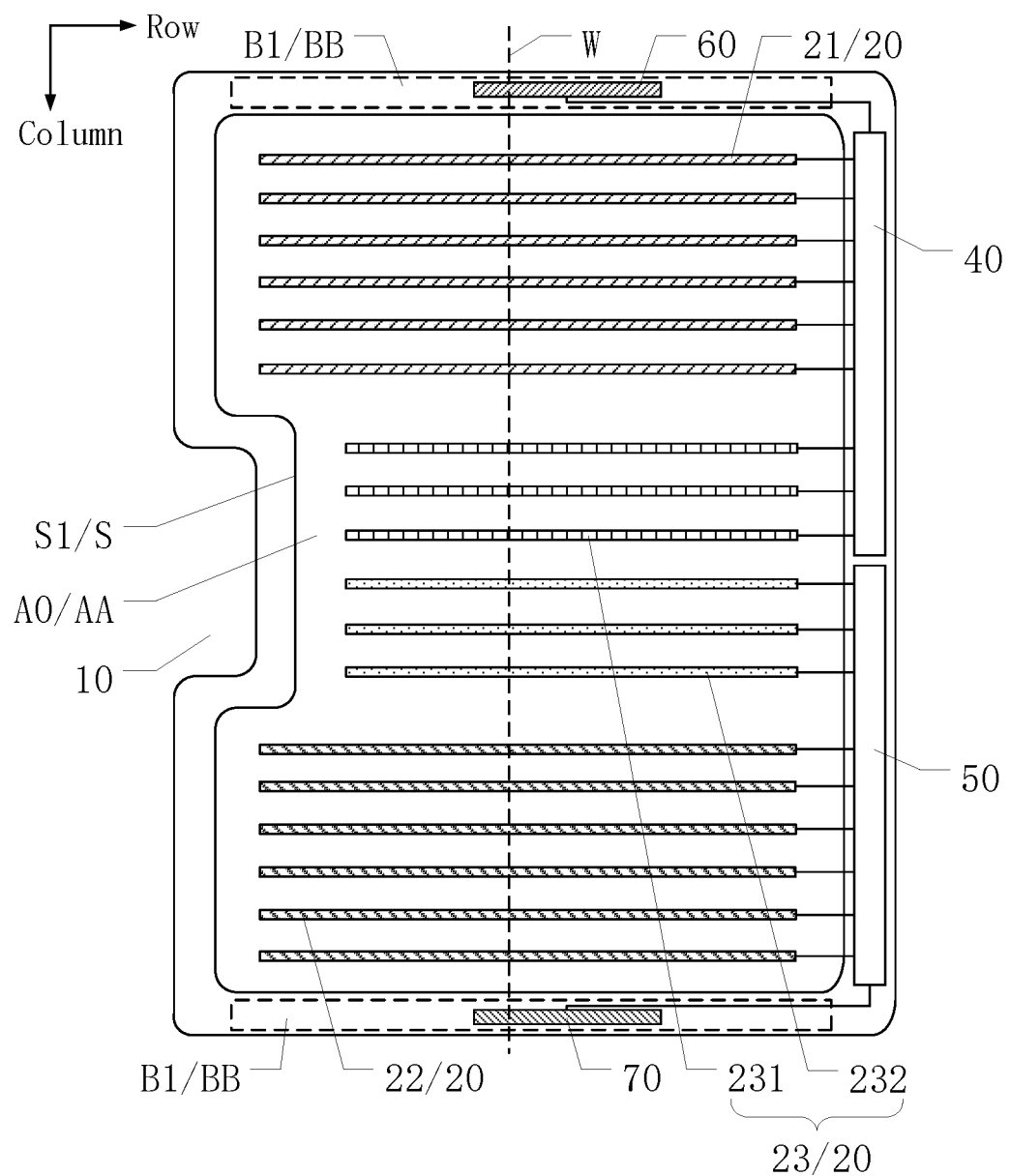
FIG. 17 illustrates a planar structure diagram of another exemplary display panel according to various embodiments of the present disclosure.
Figure 18:
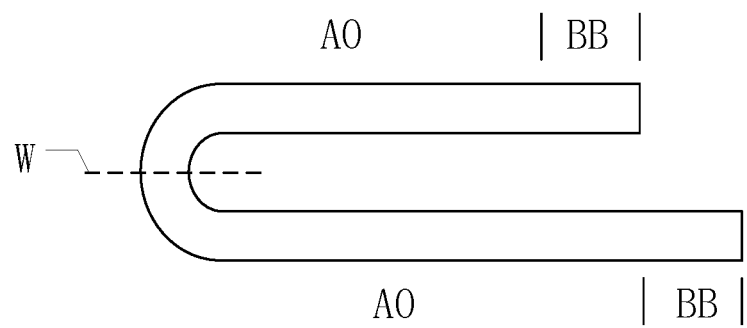
FIG. 18 illustrates a schematic diagram of a folding state of the exemplary display panel as illustrated in FIG. 17 according to various embodiments of the present disclosure.

In one embodiment of the present disclosure with reference to FIGS. 17-18, the display area AA may be divided into at least two sub-display areas A0 along a folding shaft W. The folding shaft W may extend along a first direction, where the first direction may intersect, the row direction. The display panel may have a flat-panel state and a folding state. When the display panel was in the flat-panel state, the at least two sub-display areas A0 may be located in a same plane. When the display panel was in the folding state, the at least two sub-display areas A0 may be at least partially overlapped along a direction perpendicular to the display panel.

In the embodiments of the present disclosure, the folding shaft W may extend along the first direction which may intersect the row direction. The width of each of the sub-display areas A0 along the row direction may be the same. Alternatively, only part of the sub-display areas A0 along the row direction may have a same width, or each of the sub-display areas A0 along the row direction may have different widths, for which the present disclosure will not intend to be limiting. Furthermore, the folding shaft W may be designed according to various requirements in the practical applications. In some of the embodiments of the present disclosure, the folding shaft W nay extend along the first direction which is parallel to the column direction. Nevertheless, it is for exemplary purposes only, and not intended to be limiting.

In the embodiments of the present disclosure with reference to FIG. 17, when the display panel was in the flat-panel state, the display panel was not folded along the folding shaft W. The at least two sub-display areas A0 may be in a same plane, and the size of the displayed image may be maximized, providing better visual experience.

In the embodiments of the present disclosure with reference to FIG. 18, when the display panel was in the folding state, the at least two sub-display areas A0 may be at least partially overlapped with each other along the direction perpendicular to the display panel, which makes it easier to store and carry the display apparatus. Using the folding shaft W illustrated in FIG. 18 as an example, the display area AA may be divided into two sub-display areas A0 by the folding shaft W. When the widths of the two sub-display areas A0 along the row direction are different from each other, the two sub-display areas A0 may not be completely overlapped with each other along the direction perpendicular to the display panel after the display panel was folded along the folding shaft W. When the widths of the two sub-display areas A0 along the row direction are the same, the two sub-display areas A0 may be completely overlapped with each other along the direction perpendicular to the display panel after the display panel was folded along the folding shaft W. Nevertheless, it may not be necessary for the non-display areas BB located at two opposite sides of the display area AA to be completely overlapped with each other. The detailed arrangements of the non-display areas BB located at two opposite sides of the display area AA may be determined according to the width of the non-display areas BB along the row direction, for which the present disclosure will not intend to be limiting.

Figure 19:
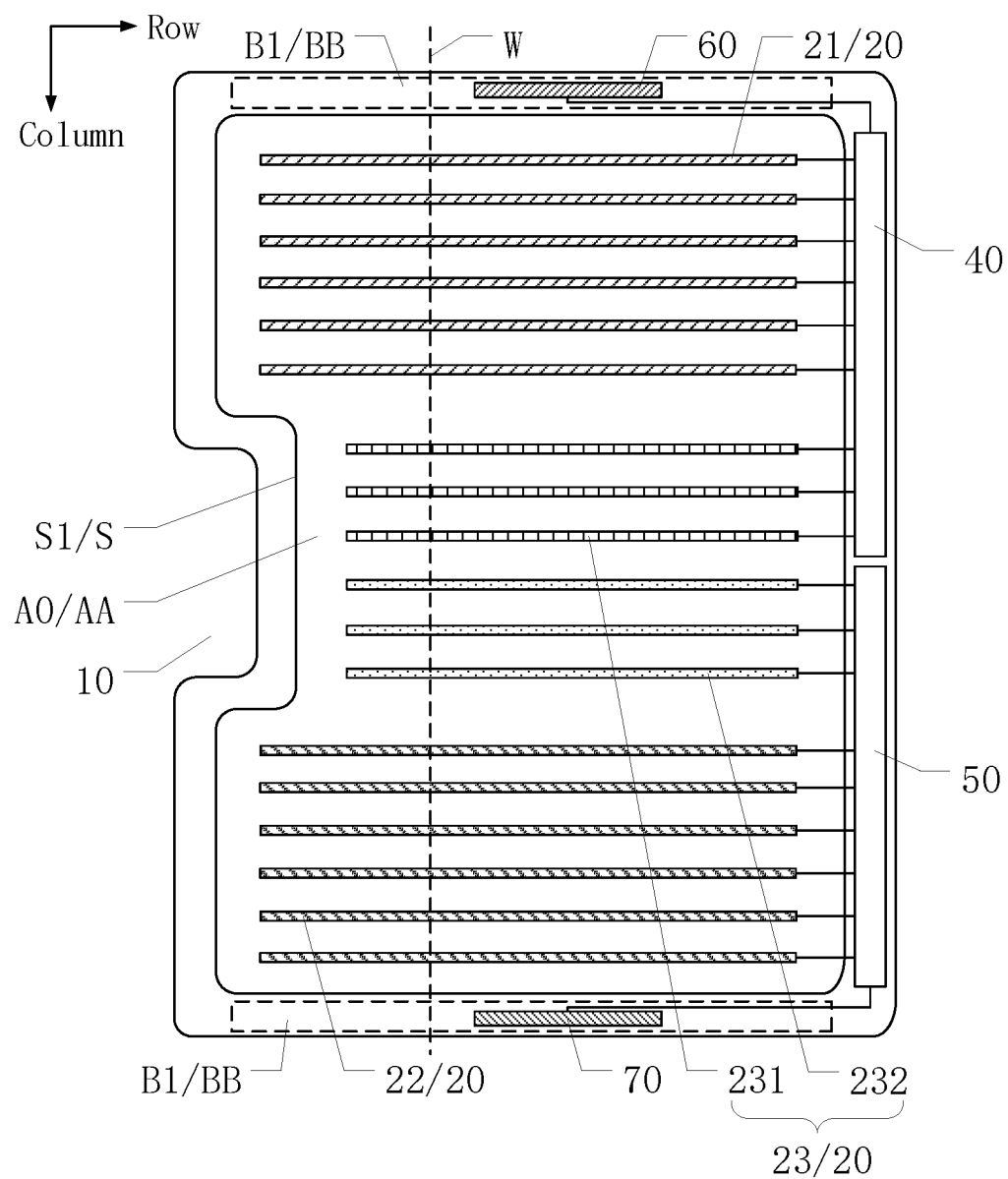
FIG. 19 illustrates a planar structure diagram of another exemplary display panel according to various embodiments of the present disclosure.

In one embodiment of the present disclosure with reference to FIG. 19, the first driving unit 60 and the second driving unit 70 may not be overlapped with the folding shaft W. In the embodiments, neither the first driving unit 60 nor the second driving unit 70 is overlapped with the folding shaft W. As such, when the display panel was folded along the folding shaft W, the first driving unit 60 and the second driving unit 70 may not be influenced or even damaged by the folding operation of the display panel. It may be advantageous to extend the use life of the first driving unit 60 and the second driving unit 70, and to reduce the difficulty of wiring in the non-display area BB.

Figure 20:
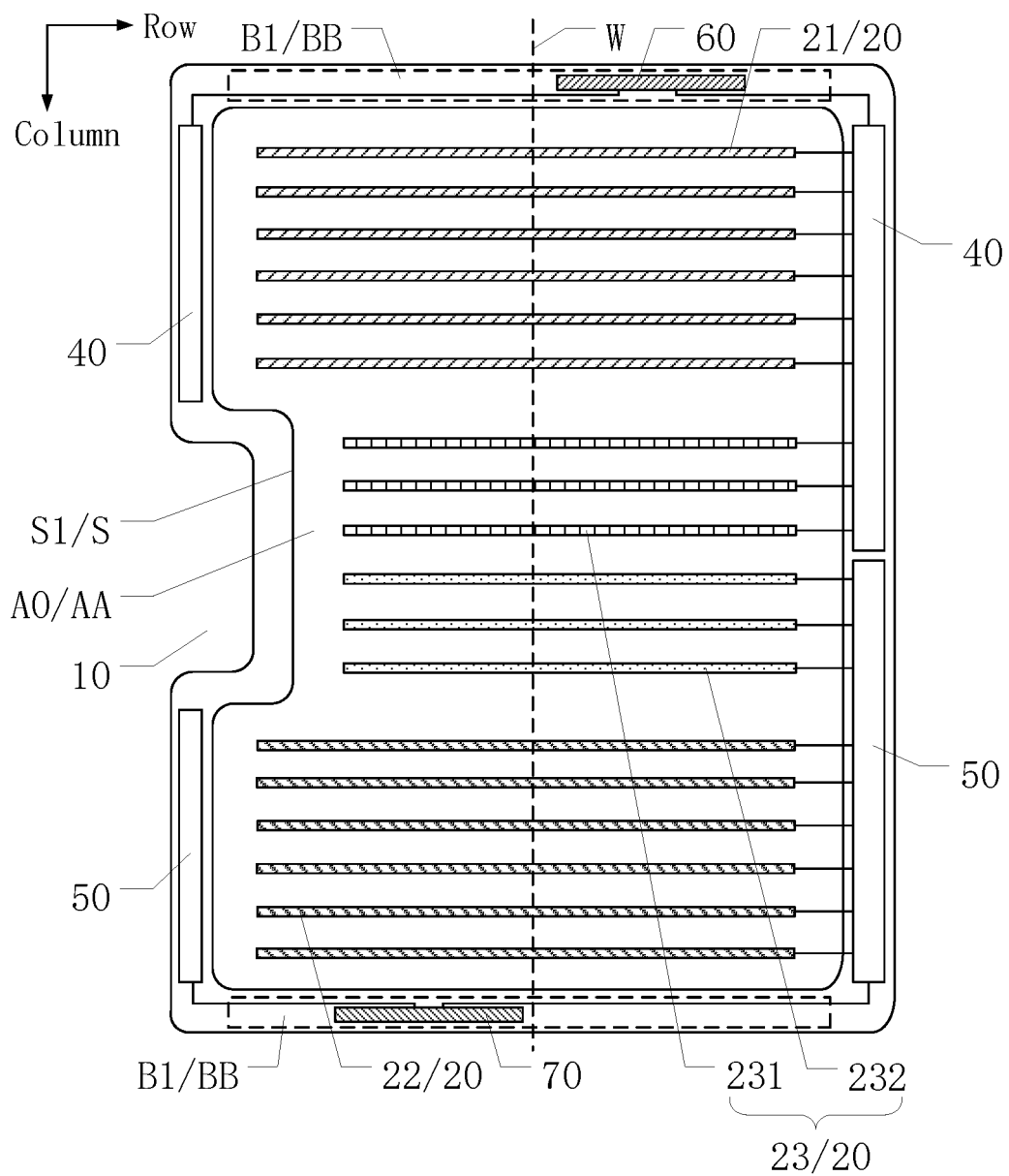
FIG. 20 illustrates a planar structure diagram of another exemplary display panel according to various embodiments of the present disclosure.

In one embodiment of the present disclosure with reference to FIG. 20, along the row direction, the first driving unit 60 may be disposed at one side of the folding shaft W, and the second driving unit 70 may be disposed at the other side of the folding shaft W. In the embodiments of the present disclosure, the first driving circuit 60 and the second driving circuit 70 are disposed at two sides of the folding shaft W, respectively. As such, they may not be damaged by the folding operation of the display panel. Further, in a case where the driving units are disposed at both sides of the display area AA along the row direction, the differences in the brightness between the at least two sub-display areas A0 may be effectively reduced, thereby improving the uniformity of the displayed images.

Figure 21:
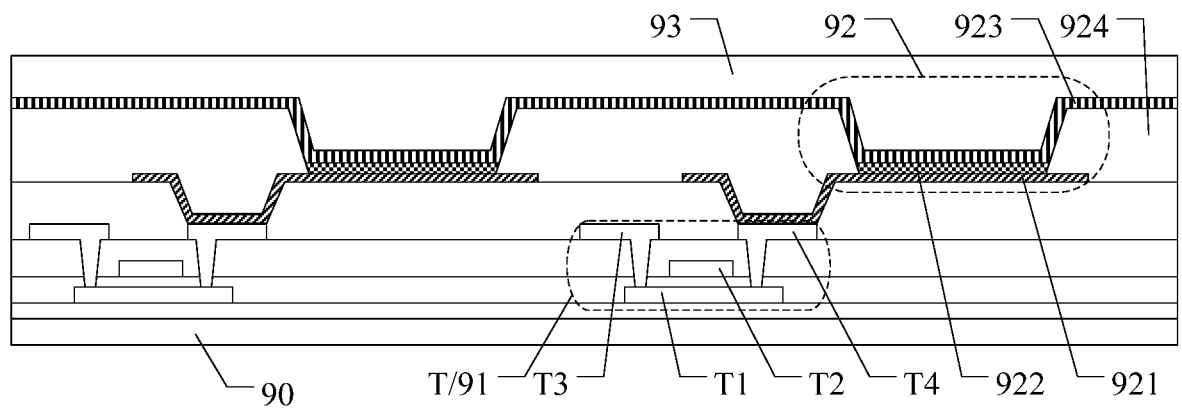
FIG. 21 illustrates a cross-sectional view of an exemplary display panel according to various embodiments of the present disclosure.

In one embodiment of the present disclosure with reference to FIGS. 1, 2 and 21, the display panel may be a flexible display panel with various advantages including better deformability and bendability, which may provide diverse visual effects and user experience. It should be noted that to illustrate the technical solutions of the present disclosure more intuitively, FIG. 21 only illustrates the structures of part of the main film layers.

In the embodiments of the present disclosure with reference to FIG. 21, the flexible display panel may include a flexible substrate 90, an array film layer 91, an organic light-emitting component 92 and a thin-film encapsulating layer 93. The array film layer 91 may be disposed on one side of the flexible substrate 90. The organic light-emitting component 92 may be disposed on one side of the array film layer 91 away from the flexible substrate 90. The thin-film encapsulating layer 93 may be disposed on one side of the organic light-emitting component 92 away from the array film layer 91. Specifically, the flexible substrate 90 may be made of transparent, semi-transparent or opaque flexible materials, including polyimide. The array film layer 91 may include a plurality of thin-film transistors T, as well as the first signal lines 20 and the second signal lines 30 according to various aforementioned embodiments of the present disclosure, A thin-film transistor T may include a semiconductor layer T1, a gate electrode T2, a source electrode T3 and a drain electrode T4. The first signal lines 20 may be electrically connected to the gate electrode T2 and the second signal lines 30 may be electrically, connected to the source electrode 13. The organic light-emitting component 92 may include a first electrode 921, a light-emitting layer 922, a second electrode 923 and a pixel-defining layer 924. The first electrode 921 may be electrically connected to the drain electrode T4 of the thin-film transistor T. As such, the first signal lines 20 and the second signal lines 30 may control the on and off states of the organic light-emitting component 92 through the thin-film transistor T. Furthermore, the thin-film encapsulating layer 93 may include two inorganic encapsulating layers and an organic encapsulating layer sandwiched between the two inorganic encapsulating layers. The inorganic encapsulating layers may be formed by chemical vapor deposit or atomic layer deposition, acid the organic encapsulating layer may be formed by inkjet processes.

The present disclosure further provides a display apparatus, including any of the display panels as described in various aforementioned embodiments of the present disclosure.

Figure 22:
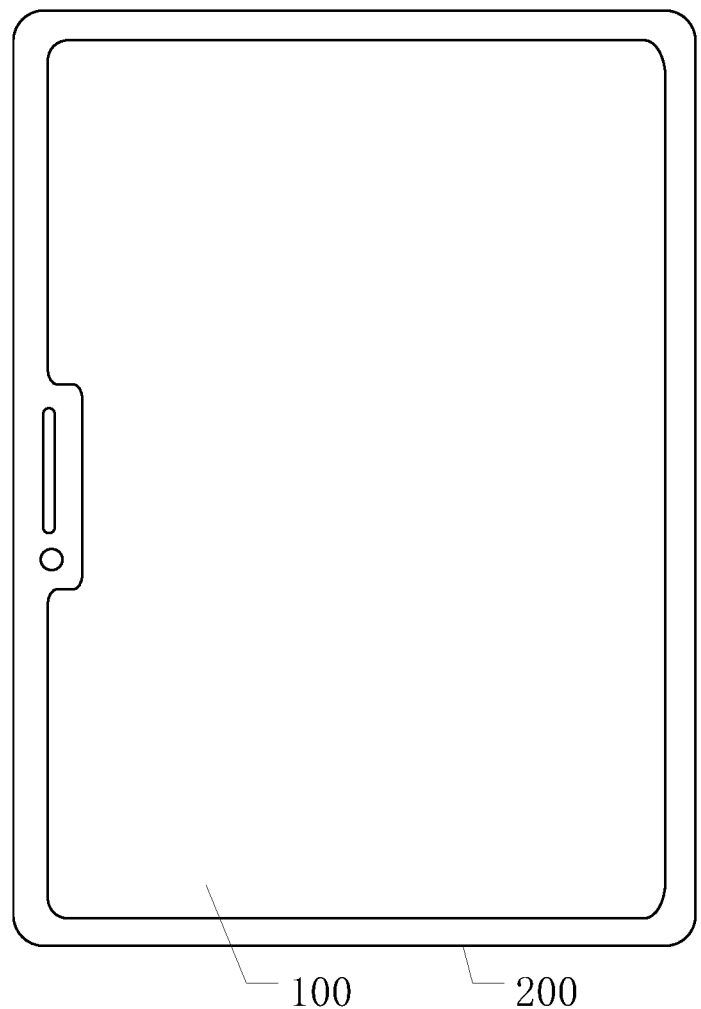
FIG. 22 illustrates a schematic diagram of an exemplary display apparatus according to various embodiments of the present disclosure.

With reference to FIG. 22, the disclosed display apparatus 200 may include any of the display panels 100 as described in the present disclosure. FIG. 22 illustrates the display apparatus 200 using a tablet for exemplary purposes only, and not intended to be limiting. It should be noted that the display apparatus according to the embodiments of the present disclosure may be any display apparatus with display functions, including a mobile phone, a television, a vehicle display, etc., for which the present disclosure will not intend to be limiting. The display apparatus disclosed in the embodiments of the present disclosure may have the beneficial effects of the display panel referring to the detailed description in the aforementioned embodiments, which will not be repeated herein.

As disclosed herein, the display panel and the display apparatus according to the embodiments of the present disclosure may have at least the beneficial effects listed in the following.

An irregularly-shaped edge of the display panel may include a sub-edge where a notch may be formed. Functional components including cameras and speakers may be disposed in the notch area, such that the screen ratio of the display panel may be improved, fulfilling diverse needs for visual effects from users. The first regular signal line disposed in the first regular display area and the first irregularly-shaped signal line disposed in the irregularly-shaped display area may be driven by the first driving circuit. The second regular signal line disposed in the second regular display area and the second irregularly-shaped signal line disposed in the irregularly-shaped display area may be driven by the second driving circuit. On one hand, such design may reduce the wiring density in the non-display area, further improving the screen ratio of the display panel. On the other, such design may reduce the difference in the load of the signal lines disposed in the first regular display area, the second regular display area and the irregularly-shaped display area, improving the uniformity in the brightness of the displayed images and ensuring the display quality of the display panel. In addition, two driving circuits including the first driving circuit and the second driving circuit, may be disposed, respectively. As such, it may be more flexible and convenient to arrange the wirings for the driving circuits in the non-display area, thereby significantly reducing the difficulty in manufacturing display apparatuses and improving the production efficiency.

Apparently, it is unnecessary for any one of the various embodiments of the present disclosure to simultaneously achieve each of the beneficial effects as disclosed above.

Although the present disclosure has been described in detail with reference to the foregoing embodiments, it is readily apparent to one with ordinary skill in the art that the foregoing embodiments as described are merely for explanatory purpose, and not intended to be limiting. It is also apparent to one ordinary skill in the art that these embodiments may be modified or substituted, without departing from the scope of the various embodiments of the present disclosure. Instead, the scope of the present disclosure is defined by appended claims.

What is claimed is:

1. A display panel, comprising:
   a display area;
   a non-display area surrounding the display area; and
   at least one notch, wherein:
   the display area includes an irregularly-shaped edge, a plurality of first signal lines and a plurality of second signal lines, the plurality of first signal lines extending along a row direction, and the irregularly-shaped edge and the plurality of second signal lines extending along a column direction,
   the irregularly-shaped edge includes at least one sub-edge, the at least one sub-edge being recessed towards an inner part of the display area, thereby forming the notch,
   the display area includes a first regular display area, a second regular display area and an irregularly-shaped display area, the irregularly-shaped display area and the notch being arranged along the row direction, the first regular display area and the second regular display area being disposed at two opposite sides of the irregularly-shaped display area along the column direction, respectively,
   a first signal line of the plurality of first signal lines disposed in the first regular display area is a first regular signal line, a first signal line of the plurality of first signal lines disposed in the second regular display area is a second regular signal line, and first signal lines of the plurality of first signal lines disposed in the irregularly-shaped display area include irregularly-shaped signal lines, the irregularly-shaped signal lines having at least one irregularly-shaped signal line as a first irregularly-shaped signal line, and other irregularly-shaped signal line as a second irregularly-shaped signal line, and
   the non-display area includes a first driving circuit and a second driving circuit, the first driving circuit being electrically connected to the first regular signal line and the first irregularly-shaped signal line, and the second driving circuit being electrically connected to the second regular signal line and the second irregularly-shaped signal line.

2. The display panel according to claim 1, wherein:
   an odd-numbered row of irregularly-shaped signal line includes the first irregularly-shaped signal line and an even-numbered row of irregularly-shaped signal line includes the second irregularly-shaped signal line, or
   an even-numbered row of irregularly-shaped signal line includes the first irregularly-shaped signal line and an odd-numbered row of irregularly-shaped signal line includes the second irregularly-shaped signal line.

3. The display panel according to claim 1, wherein:
   the first driving circuit includes a first initialization signal line and a plurality of first shift registers connected in cascade, wherein an output terminal of one first shift register of the plurality of first shift registers is electrically connected to at least one first regular signal line, at least one first irregularly-shaped signal line, or a combination thereof, and an input terminal of a first level first shift register of the plurality of first shift registers is electrically connected to the first initialization signal line, and
   the second driving circuit includes a second initialization signal line and a plurality of second shift registers connected in cascade, wherein an output terminal of one second shift register of the plurality of second shift registers is electrically connected to at least one second regular signal line, at least one second irregularly-shaped signal line, or a combination thereof, and an input terminal of a first level second shift register of the plurality of second shift registers is electrically connected to the second initialization signal line.

4. The display panel according to claim 3, wherein:
   the output terminal of the one first shift register is electrically connected to at least two first regular signal lines, at least two first irregularly-shaped signal lines, or a combination thereof, and
   the output terminal of the one second shift register is electrically connected to at least two second regular signal lines, at least two second irregularly-shaped signal lines, or a combination thereof.

5. The display panel according to claim 3, further including:
   the first driving circuit includes two first driving circuits disposed at two opposite sides of the display area along the row direction; and
   the second driving circuit includes two second driving circuits disposed at the two opposite sides of the display area along the row direction.

6. The display panel according to claim 5, wherein:
   a terminal of the first regular signal line is electrically connected to a first shift register of the plurality of first shift registers included in one of the two first driving circuits, another terminal of the first regular signal line is electrically connected to a first shift register of the plurality of first shift registers included in another one of the two first driving circuits; and
   a terminal of the second regular signal line is electrically connected to a second shift register of the plurality of second shift registers included in one of the two second driving circuits, another terminal of the second regular signal line is electrically connected to a second shift register of the plurality of second shift registers included in another one of the two second driving circuits.

7. The display panel according to claim 3, wherein:
   a terminal of the first irregularly-shaped signal line away from the notch is electrically connected to the first shift register, and
   a terminal of the second irregularly-shaped signal line away from the notch is electrically connected to the second shift register.

8. The display panel according to claim 1, wherein:
   the non-display area further includes a first sub-area and a second sub-area disposed at two opposite sides of the display area along the column direction, respectively,
   the first sub-area includes at least one first driving unit electrically connected to the first driving circuit, and
   the second sub-area includes at least one second driving unit electrically connected to the second driving circuit.

9. The display panel according to claim 8, wherein:
   the non-display area further includes at least one third driving unit disposed in one of the first sub-area and the second sub-area,
   the at least one third driving unit is electrically connected to at least one of the plurality of second signal lines.

10. The display panel according to claim 8, wherein:
    the display area includes at least two sub-display areas divided by a folding shaft, and the folding shaft extends along a first direction intersecting the row direction, the display panel includes a flat-panel state and a folding state, in the flat-panel state, the at least two sub-display areas are in a same plane, and in the folding state, the at least two sub-display areas are at least partially overlapped along a direction perpendicular to the display panel.

11. The display panel according to claim 10, wherein:

along the direction perpendicular to the display panel, the first driving unit is not overlapped with the folding shaft, and the second driving unit is not overlapped with the folding shaft.

12. The display panel according to claim 11, wherein:

along the row direction, the first driving unit is disposed at one side of the folding shaft and the second driving unit is disposed at another side of the folding shaft.

13. The display panel according to claim 1, wherein:

the first signal line includes one of a scanning signal line and a light-emitting control signal line, and the second signal line includes a data signal line.

14. The display panel according to claim 1, wherein:

the display panel includes a flexible display panel.

15. An apparatus, comprising:

a display panel including:
 a display area;
 a non-display area surrounding the display area; and
 at least one notch, wherein:
  the display area includes an irregularly-shaped edge, a plurality of first signal lines and a plurality of second signal lines, the plurality of first signal lines extending along a row direction, the irregularly-shaped edge and the plurality of second signal lines extending along a column direction,
  the irregularly-shaped edge includes at least one sub-edge, the at least one sub-edge being recessed towards an inner part of the display area, thereby forming the notch,
  the display area includes a first regular display area, a second regular display area and an irregularly-shaped display area, the irregularly-shaped display area and the notch being arranged along the row direction, the first regular display area and the second regular display area being disposed at two opposite sides of the irregularly-shaped display area along the column direction, respectively,
 a first signal line of the plurality of first signal lines disposed in the first regular display area is a first regular signal line, a first signal line of the plurality of first signal lines disposed in the second regular display area is a second regular signal line, and first signal lines of the plurality of first signal lines disposed in the irregularly-shaped display area include irregularly-shaped signal lines, the irregularly-shaped signal lines having at least one irregularly-shaped signal line as a first irregularly-shaped signal line, and other irregularly-shaped signal line as a second irregularly-shaped signal line, and
 the non-display area includes a first driving circuit and a second driving circuit, the first driving circuit being electrically connected to the first regular signal line and the first irregularly-shaped signal line, and the second driving circuit being electrically connected to the second regular signal line and the second irregularly-shaped signal line.

* * * * *